United States Patent
Ando

(10) Patent No.: US 8,587,003 B2
(45) Date of Patent: Nov. 19, 2013

(54) ORGANIC EL DISPLAY DEVICE AND MANUFACTURING METHOD OF THE SAME

(75) Inventor: Makoto Ando, Tokyo (JP)

(73) Assignee: Sony Corporation, Tokyo (JP)

( * ) Notice: Subject to any disclaimer, the term of this patent is extended or adjusted under 35 U.S.C. 154(b) by 49 days.

(21) Appl. No.: 13/248,437

(22) Filed: Sep. 29, 2011

(65) Prior Publication Data

US 2012/0097933 A1    Apr. 26, 2012

(30) Foreign Application Priority Data

Oct. 5, 2010 (JP) .................. 2010-225959

(51) Int. Cl.
*H01L 33/10* (2010.01)

(52) U.S. Cl.
USPC .............. 257/89; 257/59; 257/40; 257/98; 313/504; 313/506; 345/76; 345/108

(58) Field of Classification Search
USPC ............. 257/40, E51.019, E51.025, 89, 72; 345/694; 313/504
See application file for complete search history.

(56) References Cited

U.S. PATENT DOCUMENTS

| | | | |
|---|---|---|---|
| 7,876,339 B2 * | 1/2011 | Okazaki et al. | 345/694 |
| 8,044,575 B2 * | 10/2011 | Kawamura | 313/504 |
| 8,288,784 B2 * | 10/2012 | Cho | 257/89 |
| 8,319,234 B2 * | 11/2012 | Jeong et al. | 257/89 |
| 2003/0027369 A1 * | 2/2003 | Yamazaki | 438/21 |
| 2007/0064020 A1 * | 3/2007 | Credelle et al. | 345/694 |
| 2007/0131948 A1 * | 6/2007 | Seo et al. | 257/87 |
| 2007/0286944 A1 * | 12/2007 | Yokoyama et al. | 427/66 |
| 2011/0241000 A1 * | 10/2011 | Choi et al. | 257/59 |

FOREIGN PATENT DOCUMENTS

JP    2007-073532    3/2007

* cited by examiner

*Primary Examiner* — Eva Yan Montalvo
(74) *Attorney, Agent, or Firm* — Dentons US LLP

(57) ABSTRACT

Disclosed herein is an organic EL display device including, on a substrate: lower electrodes; first hole injection/transport layers; second organic light-emitting layers of colors other than blue; a blue first organic light-emitting layer; electron injection/transport layers; and an upper electrode.

9 Claims, 26 Drawing Sheets

1ST EXAMPLE
(3 COLORS)

2ND EXAMPLE
(3 COLORS)

3RD EXAMPLE
(3 COLORS)

4TH EXAMPLE
(3 COLORS)

5TH EXAMPLE
(3 COLORS)

6TH EXAMPLE
(3 COLORS)

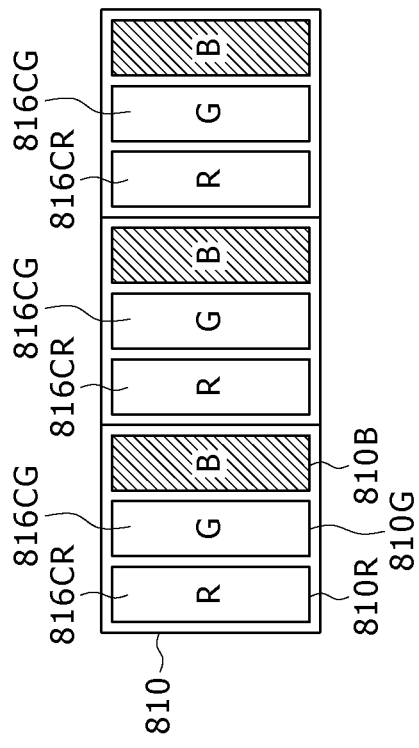
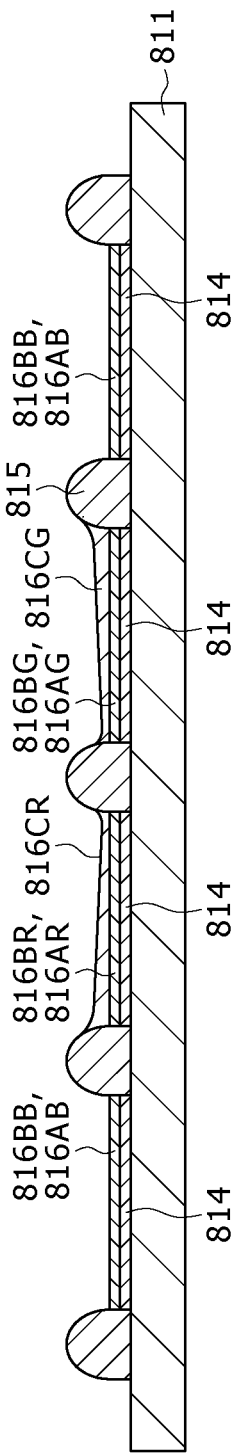

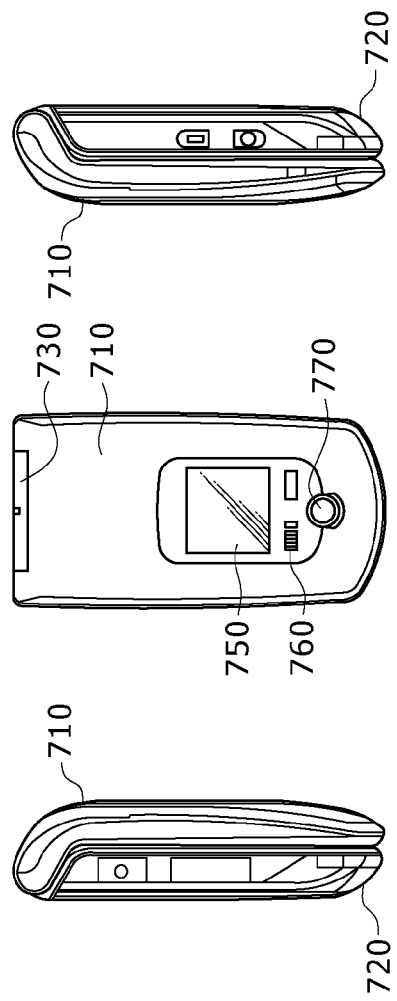
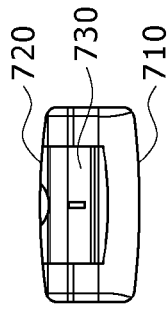
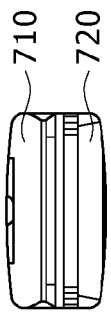
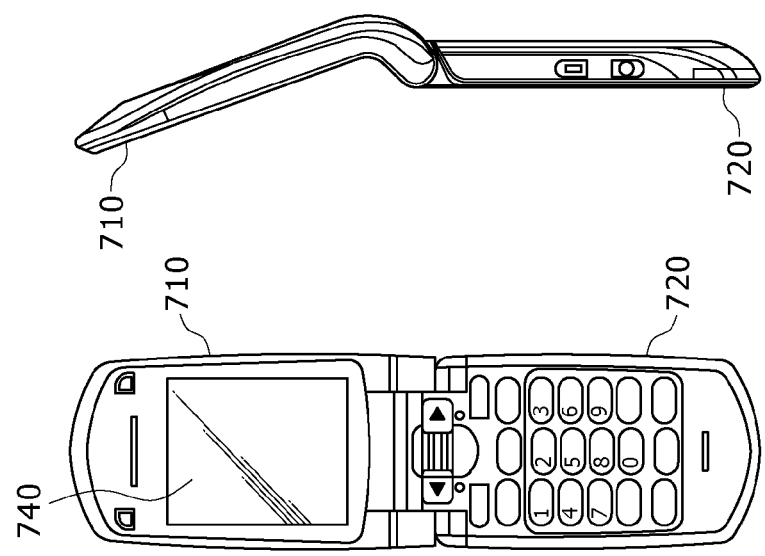

1ST EXAMPLE
(4 COLORS)

4TH EXAMPLE
(4 COLORS)

5TH EXAMPLE
(4 COLORS)

ORGANIC EL DISPLAY DEVICE AND MANUFACTURING METHOD OF THE SAME

BACKGROUND

The present disclosure relates to an organic EL (Electro Luminescence) display device that relies on the phenomenon of organic electroluminescence to emit light and a manufacturing method of the same.

The advancement of the information and telecommunication industry at an accelerating pace has led to demand for display elements offering sophisticated performance. Among these, the organic EL element that is attracting attention as a next generation display device features not only a wide view angle and excellent contrast but also quick response time.

The light-emitting layer and other layers forming an organic EL element are broadly classified into two types, namely, low and high molecular weight materials. It is commonly known that low molecular weight materials offer higher light emission efficiency and longer life. In particular, low molecular weight materials offer higher blue light performance.

In order to form an organic film, on the other hand, a dry method (vapor deposition method) such as vacuum vapor deposition is used for low molecular weight materials, and a wet method (coating or printing method) such as spin coating, ink jet or nozzle printing is used for high molecular weight materials.

The vacuum vapor deposition method is advantageous in that the process step adapted to remove the solvent is not necessary after the film formation because it is not necessary to dissolve the material adapted to form an organic thin film in the solvent. However, patterning using a metal mask is difficult. In particular, the equipment and manufacturing cost adapted to produce large-size panels is high. As a result, the method has drawbacks including its difficulty in applying the method to large-screen substrates and problem with achieving volume production. For this reason, the wet methods such as ink jet and nozzle printing are drawing attention for their relative ease in increasing the display screen size.

However, the blue light-emitting material in particular of all the high molecular weight materials used in ink jet or nozzle printing offers low emission brightness and short life, thus making it difficult to manufacture practical display products using a wet method.

Therefore, in Japanese Patent Laid-Open No. 2007-73532 (hereinafter referred to as Patent Document 1), for example, a manufacturing method is proposed in which red and green light-emitting layers are patterned for each pixel using ink jet, after which a blue light-emitting layer is formed on top thereof by vacuum vapor deposition.

SUMMARY

However, the manufacturing method using the printing method for the red and green organic layers and the vapor deposition method for the blue organic layer as disclosed in Patent Document 1 includes a process step in which the film forming material solution is applied only to the red and green pixels but not to the blue pixels. In this case, the drying speed of the applied solution is high at the regions adjacent to the blue pixels, thus drawing the undried applied solution to the regions where the solution has already dried. This leads to a non-uniform or asymmetrical thickness of the organic layer after drying, thus resulting in thick regions adjacent to the blue pixels.

The present disclosure has been made in light of the foregoing, and it is desirable to provide an organic EL display device and manufacturing method of the same for ensuring improved uniformity or symmetry in the thickness of the organic layer adjacent to the blue pixels.

An organic EL display device according to the present disclosure includes, on a substrate, lower electrodes, first hole injection/transport layers, second organic light-emitting layers of colors other than blue, blue first organic light-emitting layer, electron injection/transport layers and upper electrode. The lower electrodes are provided one for each of a blue first organic EL element and second organic EL elements of other colors. Each of the first hole injection/transport layers is provided on or above the lower electrode for one of the first and second organic EL elements and has at least a hole injection or hole transport characteristic. Each of the second organic light-emitting layers of other colors is provided on one of the first hole injection/transport layers of the second organic EL elements. The blue first organic light-emitting layer is provided over the entire surfaces of the second organic light-emitting layers and the first hole injection/transport layer of the first organic EL element. The blue first organic light-emitting layer is made of a low molecular weight material. The electron injection/transport layers are provided sequentially over the entire surface of the first organic light-emitting layer. Each of the electron injection/transport layers has at least an electron injection or electron transport characteristic. The organic EL display device includes a plurality of pixels, each of which has the first and second organic EL elements arranged in the same positional relationship. Each of the second organic EL elements is adjacent to the first organic EL elements in the same or adjacent pixel at least on its two sides opposed to each other.

A manufacturing method of an organic EL display device according to the present disclosure includes a step of forming, on a substrate, a lower electrode for each of a blue first organic EL element and second organic EL elements of other colors. The manufacturing method includes another step of forming, by a coating method, first hole injection/transport layers on or above the lower electrode, one for each of the first and second organic EL elements. Each of the first hole injection/transport layers has at least a hole injection or hole transport characteristic. The manufacturing method includes still another step of forming, by a coating method, second organic light-emitting layers of other colors on the first hole injection/transport layers of the second organic EL elements. The manufacturing method includes still another step of forming, by a vapor deposition method, a blue first organic light-emitting layer over the entire surfaces of the second organic light-emitting layers and the first hole injection/transport layer of the first organic EL element. The blue first organic light-emitting layer is made of a low molecular weight material. The manufacturing method includes still another step of forming electron injection/transport layers and an upper electrode sequentially over the entire surface of the first organic light-emitting layer. Each of the electron injection/transport layers has at least an electron injection or electron transport characteristic. A plurality of pixels are provided in the organic EL display device. Each of the pixels has the first and second organic EL elements arranged in the same positional relationship. Each of the second organic EL elements is adjacent to the first organic EL elements in the same or adjacent pixel at least on its two sides opposed to each other.

In the organic EL display device or manufacturing method of the same according to the present disclosure, each of the second organic EL elements is adjacent to the first organic EL elements in the same or adjacent pixel at least on its two sides opposed to each other. This suppresses non-uniform drying speed of the applied solution on the sides adjacent to the first organic EL elements in the manufacturing process, thus providing reduced imbalance in thickness of the organic layer after drying. This ensures improved uniformity or symmetry in the thickness of the organic layer adjacent to the blue pixels.

The organic EL display device or manufacturing method of the same according to the present disclosure arranges each of the second organic EL elements to be adjacent to the first organic EL elements in the same or adjacent pixel at least on its two sides opposed to each other. This ensures improved uniformity or symmetry in the thickness of the organic layer adjacent to the blue pixels.

BRIEF DESCRIPTION OF THE DRAWINGS

FIGS. 12A and 12B are diagrams for describing the problem with the manufacturing method used in the past;

FIG. 24A is a front view of application example in an open position, FIG. 24B is a side view thereof, FIG. 24C is a front view in a closed position, FIG. 24D is a left side view, FIG. 24E is a right side view, FIG. 24F is a top view, and FIG. 24G is a bottom view;

DETAILED DESCRIPTION OF THE PREFERRED EMBODIMENTS

A detailed description will be given below of the preferred embodiments of the present disclosure with reference to the accompanying drawings. It should be noted that the description will be given in the following order.

1. First embodiment (example in which the red and green light-emitting layers are formed by a coating method and the blue light-emitting layer is formed by a vapor deposition method as a common layer)
2. Second embodiment (example in which the blue hole transport layer is formed with a low molecular weight material)
3. Third embodiment (example in which the red and green light-emitting layers include a low molecular weight material)
4. Fourth embodiment (example in which the second hole injection/transport layer is provided on the red and green light-emitting layers and the blue hole transport layer)
5. Fifth embodiment (example in which no blue hole transport layer is provided and a second hole injection/transport layer is provided on or above the blue hole injection layer)
6. Application examples
7. Modification examples (when four colors are used)

First Embodiment

Figure 1:
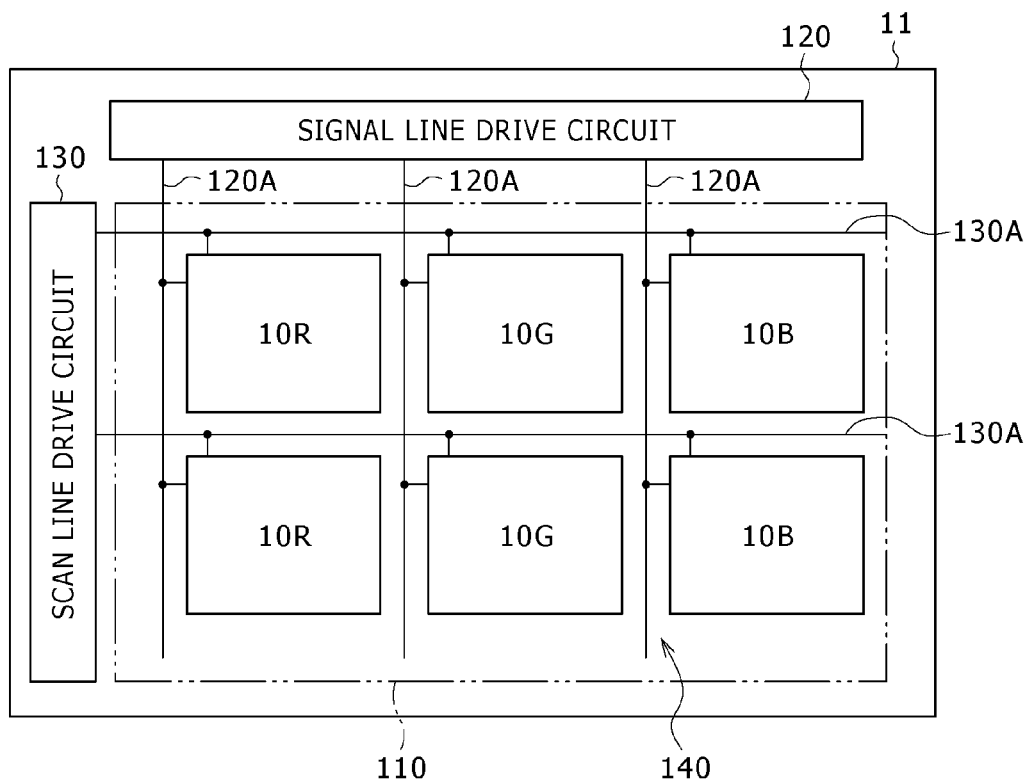
FIG. 1 is a diagram illustrating the configuration of an organic EL display device according to a first embodiment of the present disclosure.

FIG. 1 is a diagram illustrating the configuration of an organic EL display device according to a first embodiment of the present disclosure. This organic EL display device is used, for example, in an organic EL television set. The organic EL display device has, for example, a plurality of red, green and blue organic EL elements 10R, 10G and 10B arranged in a matrix form as a display region 110 on a substrate 11. The red, green and blue organic EL elements 10R, 10G and 10B will be described later. A signal line drive circuit 120 and scan line drive circuit 130, i.e., video display drivers, are provided around the display region 110.

Figure 2:
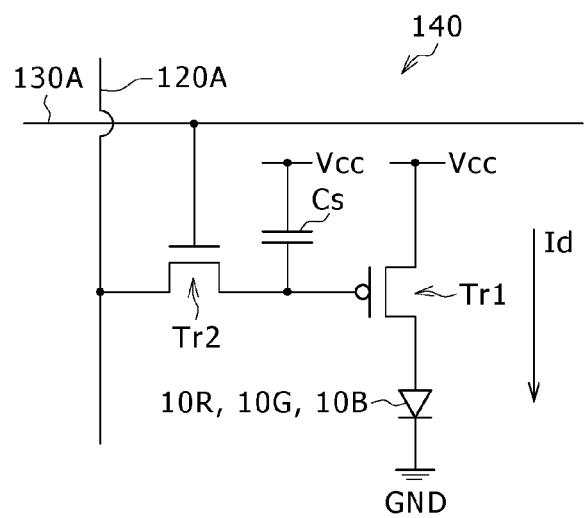
FIG. 2 is a diagram illustrating an example of a pixel drive circuit shown in FIG. 1.

Pixel drive circuits 140 are provided in the display region 110. FIG. 2 is a diagram illustrating an example of the pixel drive circuit 140 shown in FIG. 1. The same circuit 140 is an active drive circuit formed under the lower electrode 14. That is, the pixel drive circuit 140 includes a drive transistor Tr1, write transistor Tr2, capacitor (holding capacitor) Cs and red organic EL element 10R (or green or blue organic EL element 10G or 10B). The capacitor Cs is provided between the drive transistor Tr1 and write transistor Tr2. The red organic EL element 10R is connected in series to the drive transistor Tr1 between a first power supply line (Vcc) and second power supply line (GND). Each of the drive transistor Tr1 and write transistor Tr2 includes an ordinary thin film transistor (TFT). These transistors are not specifically limited in structure and may have an inverted staggered (so-called bottom gate) structure or staggered (top gate) structure.

In the pixel drive circuit 140, a plurality of signal lines 120A are arranged in the column direction, and a plurality of scan lines 130A are arranged in the row direction. The intersection between one of the signal lines 120A and one of the scan lines 130A is associated with one of the red, green and blue organic EL elements 10R, 10G and 10B (subpixels). Each of the signal lines 120A is connected to the signal line drive circuit 120 so that an image signal is supplied to the source electrode of the write transistor Tr2 from the signal line drive circuit 120 via the signal line 120A. Each of the scan lines 130A is connected to the scan line drive circuit 130 so that a scan signal is sequentially supplied to the gate electrode of the write transistor Tr2 from the scan line drive circuit 130 via the scan line 130A.

In the display region 110, on the other hand, the red organic EL elements 10R adapted to emit red light, the green organic EL elements 10G adapted to emit green light and the blue organic EL elements 10B adapted to emit blue light, are arranged sequentially in a matrix form as a whole. It should be noted that a combination of the red, green and blue organic EL elements 10R, 10G and 10B adjacent to each other makes up a pixel. Here, the blue organic EL element 10B corresponds to a specific example of a "first organic EL element" in the present disclosure. Each of the red and green organic EL elements 10R and 10G corresponds to a specific example of a "second organic EL element" in the present disclosure.

Figure 3:
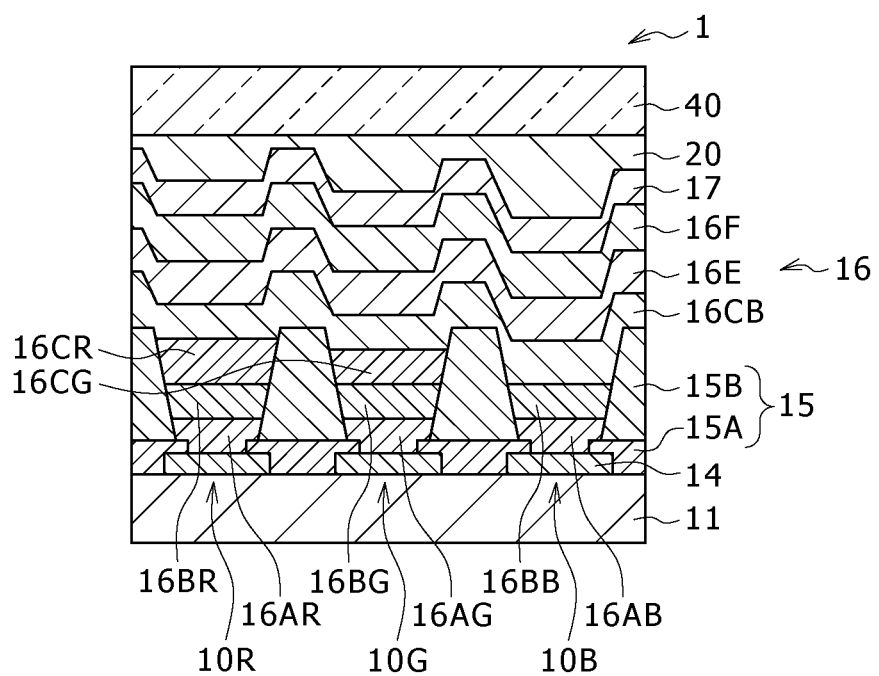
FIG. 3 is a sectional view illustrating the configuration of the display region shown in FIG. 1.

FIG. 3 is a sectional view illustrating the configuration of the display region 110 shown in FIG. 1. Each of the red, green and blue organic EL elements 10R, 10G and 10B includes the lower electrode 14 serving as an anode, a partition wall 15, organic layer 16 including a light-emitting layer 16C which will be described later, and an upper electrode 17 serving as a cathode that are stacked in this order from the side of the substrate 11, with the above-described drive transistor Tr1 of the pixel drive circuit 140 and a planarizing insulating film (not shown) provided therebetween.

The red, green and blue organic EL elements 10R, 10G and 10B configured as described above are covered with a protective layer 20. Further, a sealing substrate 40 made, for example, of glass is attached to the entire surface of the protective film 20 for sealing purposes, with an adhesive layer (not shown) made of a thermally or ultraviolet hardening resin provided between the protective layer 20 and the sealing substrate 40.

The substrate 11 is a support on which the red, green and blue organic EL elements 10R, 10G and 10B are arranged and formed. The substrate 11 may be of a well-known type, and a film or sheet made of quartz, glass, metal foil or resin is used. Of these materials, quartz or glass is preferred. In the case of a resin, among resin materials that can be used are methacrylic resins typified by polymethyl methacrylate (PMMA), polyesters such as polyethylene terephthalate (PET), polyethylene naphthalate (PEN) and polybutylene naphthalate (PBN) and polycarbonate resins. However, it is necessary for the substrate 11 to have a layered structure and be surface treated in such a manner as to minimize the water and gas permeability.

The lower electrode 14 is provided on the substrate 11 for each of the red, green and blue organic EL elements 10R, 10G and 10B. The thickness of the lower electrode 14 is, for example, 10 nm to 100 nm in the direction of stacking (hereinafter simply referred to as thickness). Among the materials that can be used are metal elements such as chromium (Cr), gold (Au), platinum (Pt), nickel (Ni), copper (Cu), tungsten (W) and silver (Ag) and their alloys. Further, the lower electrode 14 may have a layered structure that includes a metal film and a transparent conductive film. The metal film is made of one of the above metal elements or their alloy. The transparent conductive film is, for example, made of an alloy of indium and tin oxide (ITO), InZnO (indium zinc oxide) or an alloy of zinc oxide (ZnO) and aluminum (Al). It should be noted that if the lower electrode 14 is used as a cathode, it is preferred that the lower electrode 14 should be made of a material with high hole injection capability. It should be noted, however, that those materials such as aluminum (Al) alloys having an oxide coating on the surface or other materials whose hole injection barrier caused by a small work function is problematic can be used as the lower electrode 14 if a proper hole injection layer is provided.

The partition wall 15 is designed not only to ensure insulation between the lower electrodes 14 and upper electrode 17 but also to shape the light-emitting region into a desired form. The partition wall 15 is also capable of serving as a partition wall during coating by the ink jet or nozzle printing method in the manufacturing process which will be described later. The same wall 15 includes a lower partition wall 15A and upper partition wall 15B. The upper partition wall 15B is made of a photosensitive resin such as positive photosensitive polybenzoxazole or positive photosensitive polyimide and provided on the lower partition wall 15A made of an inorganic insulating material such as SiO2. The partition wall 15 has an opening for the light-emitting region. It should be noted that the organic layer 16 and upper electrode 17 may be provided not only above the opening but also on or above the partition wall 15. However, light emission takes place only through the opening of the partition wall 15.

The organic layer 16 of the red organic EL element 10R includes, for example, a hole injection layer 16AR, hole transport layer 16BR, red light-emitting layer 16CR, blue light-emitting layer 16CB, electron transport layer 16E and electron injection layer 16F that are stacked in this order from the side of the lower electrode 14. The organic layer 16 of the green organic EL element 10G includes, for example, a hole injection layer 16AG, hole transport layer 16BG, green light-emitting layer 16CG, the blue light-emitting layer 16CB, electron transport layer 16E and electron injection layer 16F that are stacked in this order from the side of the lower electrode 14. The organic layer 16 of the blue organic EL element 10B includes, for example, a hole injection layer 16AB, hole transport layer 16BB, the blue light-emitting layer 16CB, electron transport layer 16E and electron injection layer 16F that are stacked in this order from the side of the lower electrode 14. Of these, the blue light-emitting layer 16CB, electron transport layer 16E and electron injection layer 16F are provided as common layers to be shared among the red, green and blue organic EL elements 10R, 10G and 10B.

The hole injection layers 16AR, 16AG and 16AB are designed to provide improved hole injection efficiency and serve also as buffer layers adapted to prevent leaks. The same layers 16AR, 16AG and 16AB are provided on the lower electrodes 14 respectively for the red, green and blue organic EL elements 10R, 10G and 10B.

The thickness of the hole injection layers 16AR, 16AG and 16AB should preferably be, for example, 5 nm to 100 nm, and more preferably be 8 nm to 50 nm. It is only necessary to select the material of the hole injection layers 16AR, 16AG and 16AB as appropriate according to the relationship with the materials of the electrode and adjacent layer. Among the materials that can be used as the hole injection layers 16AR, 16AG and 16AB are polyaniline and its derivatives, polythiophene and its derivatives, polypyrrole and its derivatives, polyphenylene vinylene and its derivatives, polyethylene vinylene and its derivatives, polyquinoline and its derivatives, polyquinoxaline and its derivatives, conductive high molecular weight compounds such as polymers including an aromatic amine structure in the main or side chain, metal phthalocyanines (e.g., copper phthalocyanine) and carbon.

If a high molecular weight material is used as the hole injection layers 16AR, 16AG and 16AB, the weight-average molecular weight (Mw) thereof should preferably be about 2000 to 10000 for an oligomer or 10000 to 300000, and should particularly preferably be about 5000 to 200000. If the Mw is less than 5000, the hole injection layer is likely to dissolve during the formation of the hole transport layer and other overlying layers. On the other hand, if the Mw is greater than 300000, the material is likely to gel, thus making the film formation difficult.

Among the typical conductive high molecular weight compounds used as the hole injection layers 16AR, 16AG and 16AB are polyaniline, oligoaniline and polydioxythiophenes such as poly(3,4-ethylenedioxythiophene) (PEDOT). These compounds include a polymer in the name of Nafion (trademark) and another in a dissolved form in the name of Liquion (trademark) commercially available from H.C. Starck, ELSOURCE from Nissan Chemical Industries and Verazol (trademark), a conductive polymer from Soken Chemical and Engineering.

The hole transport layers 16BR, 16BG and 16BB are designed to provide improved efficiency in transporting holes respectively to the red, green and blue light-emitting layers 16CR, 16CG and 16CB. The same layers 16BR, 16BG and 16BB are provided respectively on the hole injection layers 16AR, 16AG and 16AB respectively for the red, green and blue organic EL elements 10R, 10G and 10B.

Although depending on the overall configuration of the elements, the thickness of the hole transport layers 16BR, 16BG and 16BB should preferably be, for example, 10 nm to 200 nm, and more preferably be 15 nm to 150 nm. Among the high molecular weight materials that can be used as the hole transport layers 16BR, 16BG and 16BB are light-emitting materials that can be dissolved in an organic solvent such as polyvinylcarbazole and its derivatives, polyfluorene and its derivatives, polyaniline and its derivatives, polysilane and its derivatives, polysiloxane derivatives having an aromatic amine structure in the side or main chain, polythiophene and its derivatives and polypyrrole.

The weight-average molecular weight (Mw) of a high molecular weight material should preferably be about 50000 to 300000, and should particularly preferably be 100000 to 200000. If the Mw is less than 50000, low molecular weight components fall out of the high molecular weight material when the light-emitting layers are formed, thus resulting in dots in the hole injection/transport layers. This may lead to reduced initial performance of the organic EL elements or deterioration thereof. On the other hand, if the Mw is greater than 300000, the material is likely to gel, thus making the film formation difficult.

It should be noted that the weight-average molecular weight (Mw) is a polystyrene-equivalent weight-average molecular weight found by gel permeation chromatography (GPC) using tetrahydrofuran as a solvent.

When an electric field is applied to the red and green light-emitting layers 16CR and 16CG, the electrons and holes recombine, thus emitting light. The thickness of the red and green light-emitting layers 16CR and 16CG should preferably be, for example, 10 nm to 200 nm, and more preferably be 15 nm to 150 nm. Among the materials that can be used as the same layers 16CR and 16CG are polyfluorene-based high molecular weight derivatives, (poly)paraphenylene vinylene derivatives, polyphenylene derivatives, polyvinylcarbazole derivatives, polythiophene derivatives, perylene-based dyes, coumarin-based dyes, rhodamine-based dyes and any of the above high molecular weight compounds doped with an organic EL material. For example, the high molecular weight compound can be doped with rubrene, perylene, 9,10-diphenylanthracene, tetraphenylbutadiene, nile red or coumarin 6.

When an electric field is applied to the blue light-emitting layer 16CB, the electrons and holes recombine, thus emitting light. The blue light-emitting layer 16CB is provided over the entire surfaces of the red and green light-emitting layers 16CR and 16CG and the hole transport layer 16BB of the blue organic EL element 10B as a common layer. The blue light-emitting layer 16CB is formed by doping an anthracene compound, i.e., a host material, with a guest material made of an organic light-emitting material such as blue or green low molecular weight fluorescent dye, phosphorescent dye or metal complex, thus emitting blue or green light.

The electron transport layer 16E is designed to provide improved efficiency in transporting electrons to the red, green and blue light-emitting layers 16CR, 16CG and 16CB. The same layer 16E is provided over the entire surface of the blue light-emitting layer 16CB as a common layer. Among the materials that can be used as the electron transport layer 16E are quinolone, perylene, phenanthroline, bisstyryl, pyradine, triazole, oxazole, fullerene, oxadiazole, fluorenone, and their derivatives and metal complexes. More specifically, among the above materials are tris(8-hydroxyquinoline) aluminum (abbreviated as $Alq_3$), anthracene, perylene, butadiene, coumarin, C60, acridine, stilbene, 1,10-phenanthroline and their derivatives and metal complexes.

The electron injection layer 16F is designed to provide improved electron injection efficiency and provided over the entire surface of the electron transport layer 16E as a common layer. Among the materials that can be used as the electron injection layer 16F are lithium oxide ($Li_2O$), i.e., an oxide of lithium (Li), cesium carbonate ($Cs_2CO_3$), i.e., a complex oxide of cesium (Cs), and mixtures of the oxide and complex oxide. On the other hand, the material of the electron injection layer 16F is not limited to the above. Instead, alkaline earth metals such as calcium (Ca) and barium (Ba), alkaline metals such as lithium and cesium, metals with low work function such as indium (In) and magnesium (Mg), oxides, complex oxides and fluorides of these metals may be used alone or as a mixture or alloy for improved stability.

The upper electrode 17 is, for example, 3 nm to 8 nm in thickness and made of a metal conductive film. More specifically, among the materials that can be used as the upper electrode 17 are aluminum (Al), magnesium (Mg), calcium (Ca) and sodium (Na) alloys. Of these, magnesium-silver alloy (Mg—Ag alloy) is preferred for its conductivity in a thin film form and low absorbance. The ratio of magnesium and silver in Mg—Ag alloy is not specifically limited. However, it is preferred that the thickness ratio between Mg and Ag should fall within the range from 20:1 to 1:1. Further, aluminum (Al)-lithium (Li) alloy (Al—Li alloy) may be used as the upper electrode 17.

Still further, the upper electrode 17 may be a layer made of a mixture including an organic light-emitting material such as almiquinoline complexe, styrylamine derivative or phthalocyanine derivative. In this case, a layer having light transmittance may be separately provided as a third layer. It should be noted that, in the case of an active matrix driven display device, the upper electrode 17 is formed in the form of a solid film above the substrate 11 in such a manner that the same electrode 17 is insulated from the lower electrode 14 by the organic layer 16 and partition wall 15. The upper electrode 17 is provided as a common layer to be shared among the red, green and blue organic EL elements 10R, 10G and 10B.

The protective layer 20 is, for example, 2 to 3 µm in thickness and may be made of an insulating or conductive material. As insulating materials, inorganic amorphous insulating materials such as amorphous silicon ($\alpha$-Si), amorphous silicon carbide ($\alpha$-SiC), amorphous silicon nitride ($\alpha$-Si$_{1-x}$N$_x$) and amorphous carbon ($\alpha$-C) are preferred. These inorganic amorphous insulating materials do not form grains, thus making them suitable for use as a protective film.

The sealing substrate 40 is located on the side of the upper electrode 17 of the red, green and blue organic EL elements 10R, 10G and 10B. The same substrate 40 is designed to seal the red, green and blue organic EL elements 10R, 10G and 10B together with the adhesive layer (not shown). The sealing substrate 40 is made of a material such as glass transparent to light emitted by the red, green and blue organic EL elements 10R, 10G and 10B. A color filter and a light-shielding film serving as a black matrix (both not shown) are, for example, provided on the sealing substrate 40 to extract light emitted by the red, green and blue organic EL elements 10R, 10G and 10B and absorb external light reflected by the red, green and blue organic EL elements 10R, 10G and 10B and interconnects provided between the same elements 10R, 10G and 10B, thus providing improved contrast.

The color filter includes red, green and blue filters (all not shown) that are sequentially arranged to match the positions of the red, green and blue organic EL elements 10R, 10G and 10B. The red, green and blue filters are each formed, for example, to be rectangular in shape with no space therebetween. These red, green and blue filters are made of a resin mixed with a pigment. The filters have been adjusted to offer high light transmittance in the intended red, green or blue range of wavelengths and low light transmittance in the other ranges of wavelengths by selecting a proper pigment.

The light-shielding film is made of a black resin film mixed with a black coloring agent and having an optical density of 1 or more or a thin film filter that relies on thin film interference. The light-shielding film should preferably be made of a black resin film because this makes it easy to form the light-shielding film at low cost. A thin film filter includes one or more layers of thin films, each made of a metal, metal nitride or metal oxide, stacked one on top of another, and is designed to attenuate light by means of thin film interference. An example of a thin film filter includes chromium and chromium oxide (III) ($Cr_2O_3$) that are stacked alternately one on top of another.

FIGS. 4 to 9 illustrate first to sixth examples of arrangement of the red, green and blue organic EL elements 10R, 10G and 10B. The organic EL display device 1 includes a plurality of pixels 10 that are arranged in a matrix form. Each of the pixels 10 is, for example, square in planar shape and includes at least the one organic EL element 10B and also the one red organic EL element 10R and one green organic EL element 10G.

The red, green and blue organic EL elements 10R, 10G and 10B are included in each of all the pixels 10 and arranged in the same manner. Each of the red and green organic EL elements 10R and 10G is adjacent to the blue organic EL elements 10B in the same or adjacent pixel at least on its two sides opposed to each other. This allows for the organic EL display device 1 to ensure improved uniformity or symmetry in the thickness of the organic layer 16 of the red and green organic EL elements 10R and 10G.

Figure 4:
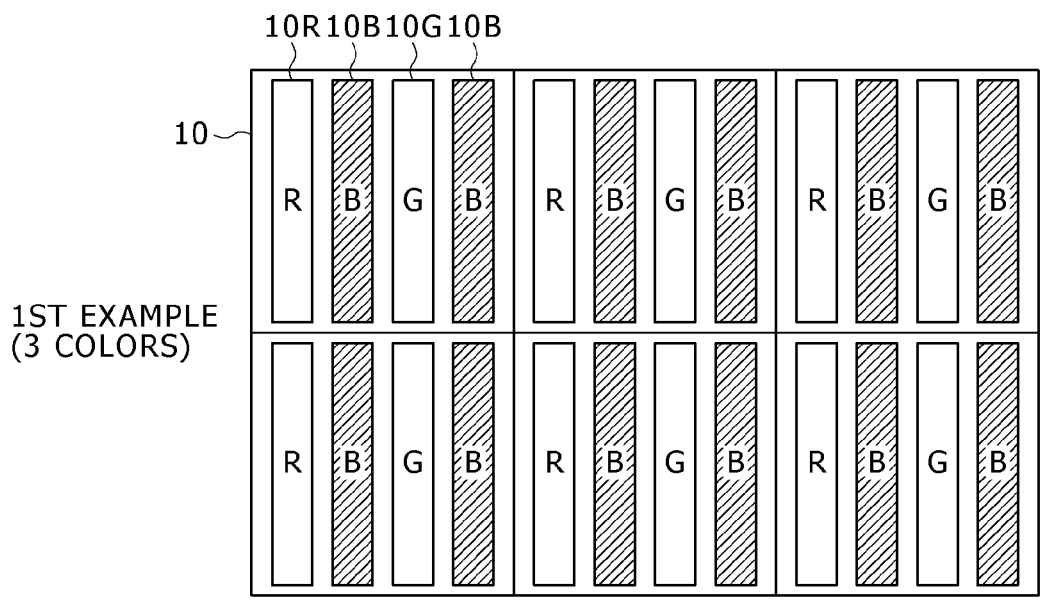
FIG. 4 is a diagram illustrating a first example of two-dimensional arrangement of organic EL elements.
Figure 5:
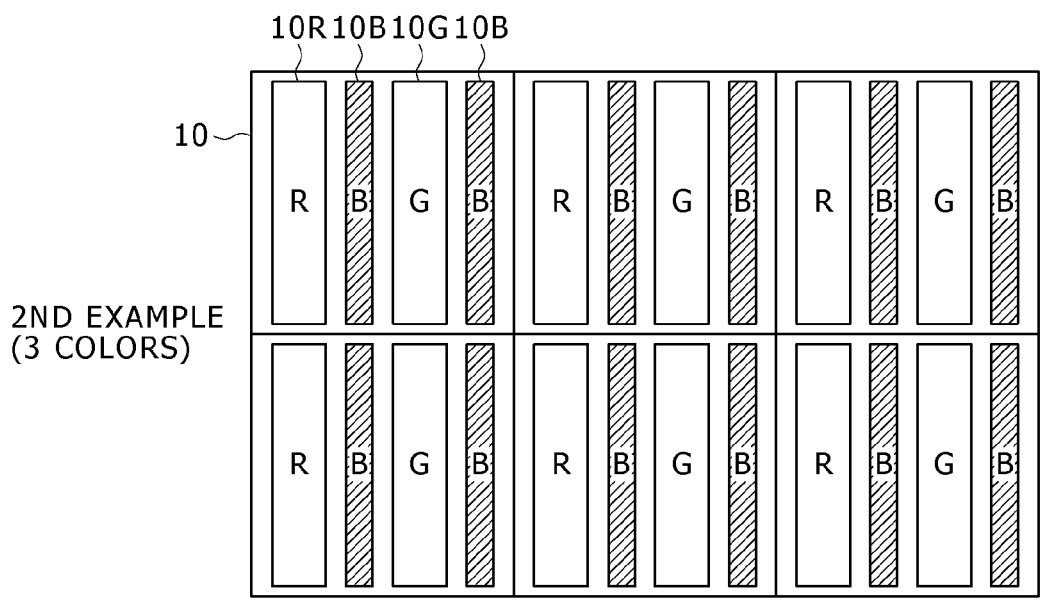
FIG. 5 is a diagram illustrating a second example of two-dimensional arrangement of organic EL elements.

In the first example shown in FIG. 4 and second example shown in FIG. 5, for example, the red, green and blue organic EL elements 10R, 10G and 10B are long, narrow and rectangular (strip) in planar shape. The red and green organic EL elements 10R and 10G are arranged equidistantly in the direction parallel to the short sides of the rectangles. The blue organic EL element 10B is arranged between the red and green organic EL elements 10R and 10G. In this case, each of the red and green organic EL elements 10R and 10G is adjacent to the blue organic EL elements 10B in the same or adjacent pixel 10 on its two long sides.

Figure 6:
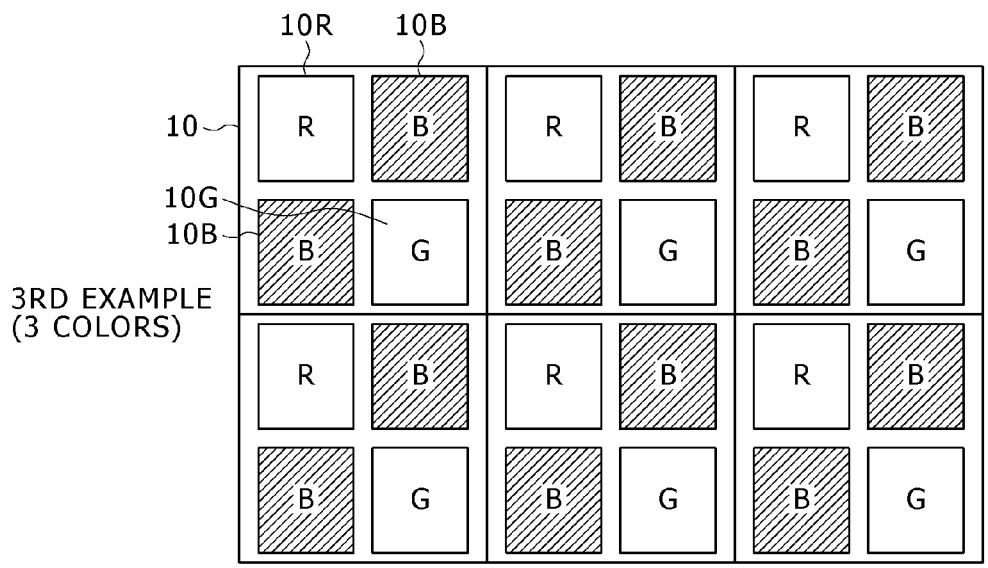
FIG. 6 is a diagram illustrating a third example of two-dimensional arrangement of organic EL elements.

In the third example shown in FIG. 6, the red and green organic EL elements 10R and 10G are arranged each at one of the two corners on a diagonal line in each of the pixels 10 (so-called staggered arrangement). That is, the red and green organic EL elements 10R and 10G are rectangular (e.g., square) in planar shape and positioned diagonally relative to each other on the same diagonal line. The blue organic EL elements 10B are rectangular (e.g., square) in planar shape and arranged in regions (top right and bottom left corners in the pixels 10) other than those of the red and green organic EL elements 10R and 10G. In this case, each of the red and green organic EL elements 10R and 10G is adjacent to the blue organic EL elements 10B in the same or adjacent pixel 10 on its all four sides.

Figure 7:
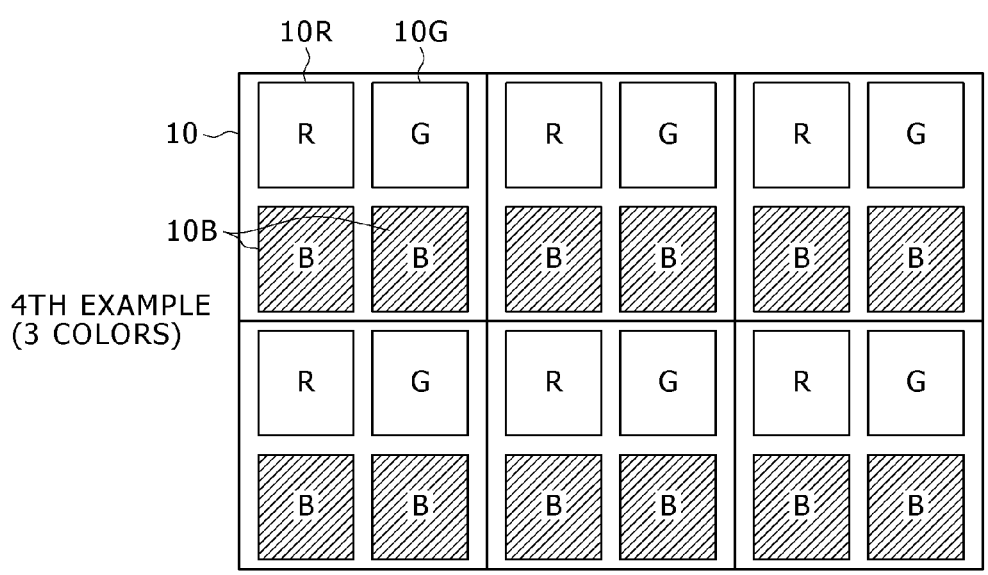
FIG. 7 is a diagram illustrating a fourth example of two-dimensional arrangement of organic EL elements.
Figure 8:
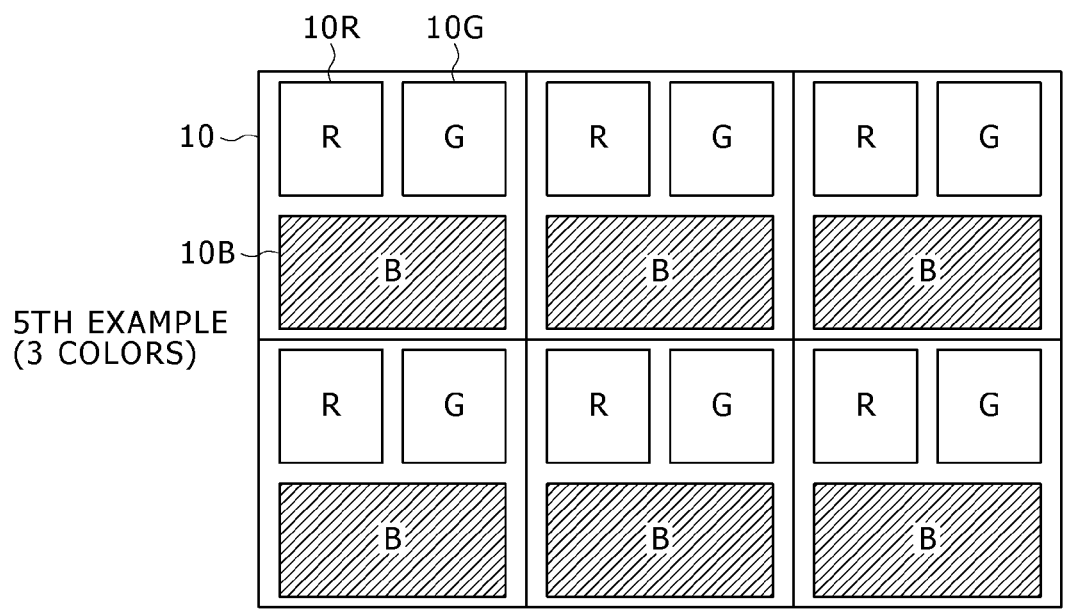
FIG. 8 is a diagram illustrating a fifth example of two-dimensional arrangement of organic EL elements.
Figure 9:
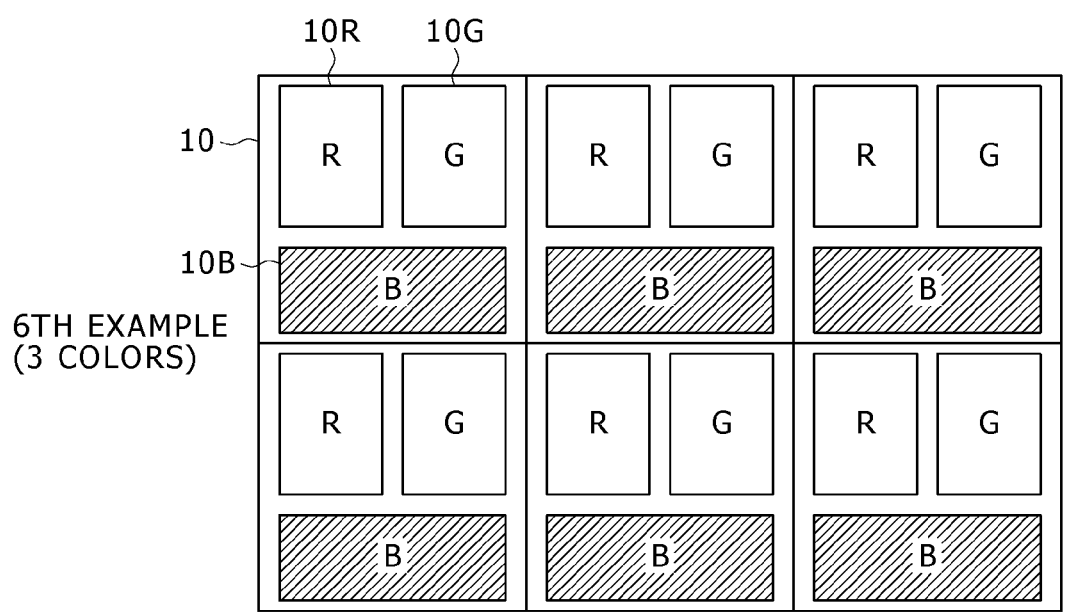
FIG. 9 is a diagram illustrating a sixth example of two-dimensional arrangement of organic EL elements.

In the fourth example shown in FIG. 7 and fifth example shown in FIG. 8 and sixth example shown in FIG. 9, the red and green organic EL elements 10R and 10G are arranged in one direction (linearly). That is, the same elements 10R and 10G are rectangular (e.g., square) in planar shape and arranged side by side (red organic EL element 10R at the top left corner and the green organic EL element 10G at the top right corner in the pixels 10). The blue organic EL elements 10B are arranged in regions (bottom left and bottom right corners in the pixels 10) other than those of the red and green organic EL elements 10R and 10G. In this case, each of the red and green organic EL elements 10R and 10G is adjacent to the blue organic EL elements 10B in the same or adjacent pixel 10 on its upper and lower sides.

The blue organic EL elements 10B may be the same in planar shape (e.g., square) as the red and green organic EL elements 10R and 10G as in the fourth example shown in FIG. 7. Alternatively, the blue organic EL elements 10B may be long, narrow and rectangular in shape that is as long as the red and green organic EL elements 10R and 10G combined as in the fifth example shown in FIG. 8 and sixth example shown in FIG. 9.

It is preferred in any of the first to sixth examples that the red and green organic EL elements 10R and 10G should be identical in area. If the same elements 10R and 10G are identical in area and if the same amount of ink is used for printing, the drying time will be the same for the same elements 10R and 10G, thus providing uniform film thickness distribution for the same elements 10R and 10G.

On the other hand, it is not always necessary for the blue organic EL element 10B to be identical in area to the red and green organic EL elements 10R and 10G. For example, there is a case in which the blue organic EL element 10B is designed to be larger in area than the red and green organic EL elements 10R and 10G because the blue organic EL element 10B has a shorter light emission life than the red and green organic EL elements 10R and 10G. Therefore, the red and green organic EL elements 10R and 10G may differ in area from the blue organic EL element 10B. In the examples other than the third example shown in FIG. 6, the area of the blue organic EL element 10B can be designed as desired.

In the first example shown in FIG. 4, for example, the red, green and blue organic EL elements 10R, 10G and 10B are equal in length of the short sides. In contrast, in the second example shown in FIG. 5, the short sides of each of the blue organic EL elements 10B are shorter than those of each of the red and green organic EL elements 10R and 10G. Further, the area of each of the blue organic EL elements 10B is smaller than that of each of the red and green organic EL elements 10R and 10G. As a result, the area of the red organic EL element 10R, that of the green organic EL element 10G and that of the two blue organic EL elements 10B combined are roughly equal.

In the fifth example shown in FIG. 8, on the other hand, the length of the short side of the blue organic EL element 10B is equal to the length of one side of each of the red and green organic EL elements 10R and 10G. In contrast, in the sixth example shown in FIG. 9, the short side of the blue organic EL element 10B is shorter than one side of each of the red and green organic EL elements 10R and 10G. As a result, the areas of the red, green and blue organic EL elements 10R, 10G and 10B are roughly equal as in the second example.

It is needless to say that the red, green and blue organic EL elements 10R, 10G and 10B can also be arranged in manners other than those in the first to sixth examples.

This organic EL display device can be manufactured, for example, in the following manner.

Figure 10:
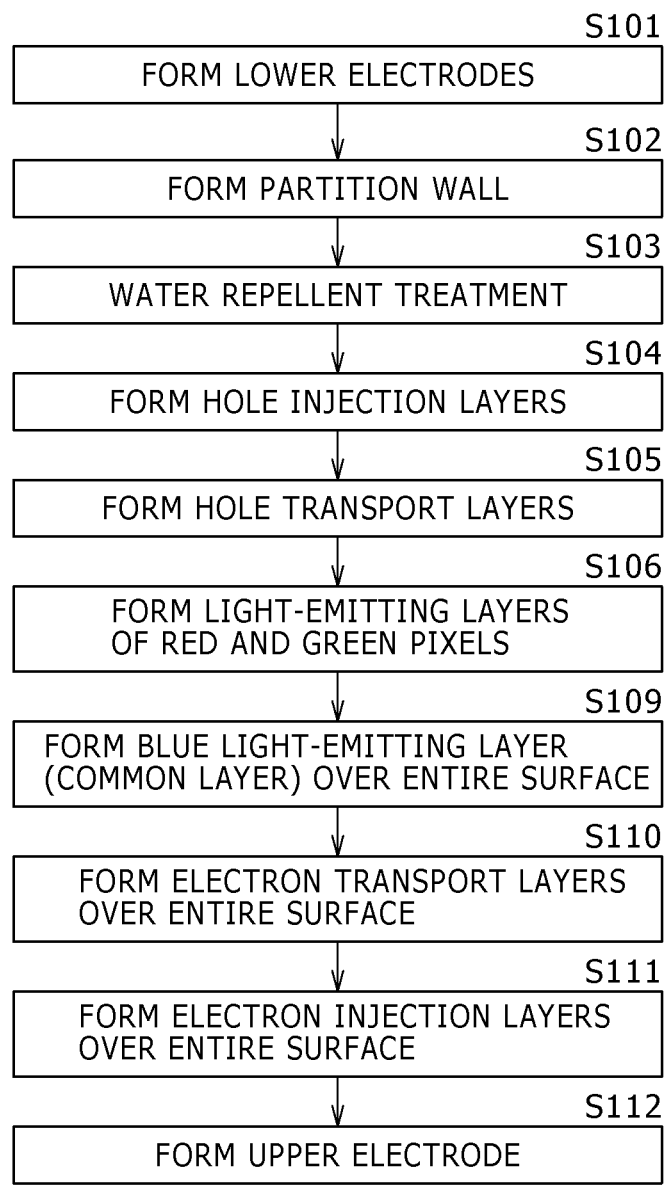
FIG. 10 is a diagram illustrating the flow of the manufacturing method of the organic EL display device shown in FIG. 1.

FIG. 10 is a diagram illustrating the flow of the manufacturing method of this organic EL display device. FIGS. 11A to 11H illustrate the manufacturing method shown in FIG. 10 in the order of execution of the process steps. First, the pixel drive circuits 140, each including the drive transistor Tr1, are formed on the substrate 11 made of the material described above. Then, a planarizing insulating film (not shown) made, for example, of a photosensitive resin is provided.

(Step of Forming the Lower Electrodes 14)

Figure 11A:
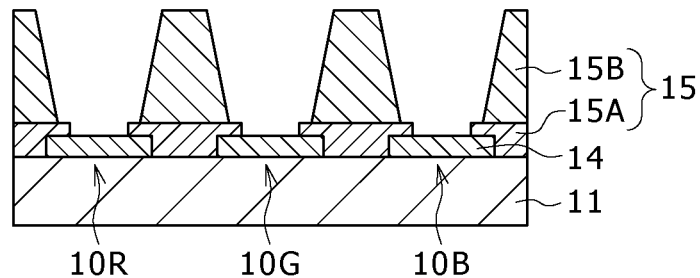
FIGS. 11A to 11C are sectional views illustrating the manufacturing method shown in FIG. 10 in the order of execution of the process steps.

Next, a transparent conductive film made, for example, of ITO is formed over the entire surface of the substrate 11 and patterned, thus forming the lower electrodes 14, one each for each of the red, green and blue organic EL elements 10R, 10G and 10B as illustrated in FIG. 11A (step S101). At this time, the lower electrodes 14 are brought into continuity with the drain electrodes of the drive transistors Tr1 via contact holes (not shown) of the planarizing insulating film (not shown).

(Step of Forming the Partition Wall 15)

Next, as illustrated in FIG. 11A, an inorganic insulating film made, for example, of SiO2 is formed by CVD (Chemical Vapor Deposition) on the lower electrodes 14 and planarizing insulating film (not shown) and patterned by photolithography and etching, thus forming the lower partition walls 15A.

Then, as illustrated in FIG. 11A, the upper partition walls 15B made of the above-described photosensitive material are formed at predetermined positions of the lower partition walls 15A, and more specifically, at the positions surrounding the light-emitting regions of the pixels. This allows for the partition wall 15 including the upper and lower partition walls 15A and 15B to be formed (step S102).

After the formation of the partition wall 15, the side of the substrate 11 on which the lower electrodes 14 and partition wall 15 are formed is oxygen plasma treated, thus removing the contaminants such as organic substances from the surface and providing improved wettability. More specifically, the substrate 11 is heated to a predetermined temperature such as about 70 to 80° C. and plasma treated ($O_2$ plasma treatment) using oxygen as a reactant gas under the atmospheric pressure.

(Step of Performing Water Repellent Treatment)

The plasma treatment is followed by the water repellent treatment (liquid repellent treatment) (step S103), thus providing reduced wettability of the top and side surfaces of the upper partition walls 15B in particular. More specifically, plasma treatment (CF4 plasma treatment) is performed using tetrafluoromethane as a reactant gas under the atmospheric pressure, followed by cooling of the substrate 11 that has been heated for the plasma treatment, thus making the top and side surfaces of the upper partition walls 15B liquid-repellent and reducing the wettability thereof.

It should be noted that the exposed surfaces of the lower electrodes 14 and the lower partition walls 15 are more or less affected by this $CF_4$ plasma treatment. However, ITO of which the lower electrodes 14 are made and SiO2 of which the lower partition walls 15 are made lack affinity for fluorine. Therefore, the surfaces whose wettability has been improved by the oxygen plasma treatment retain their wettability intact.

(Step of Forming the Hole Injection Layers 16AR, 16AG and 16AB)

Figure 11B:
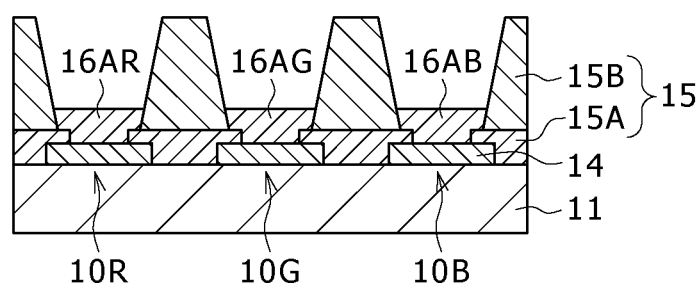

After the water repellent treatment, the hole injection layers 16AR, 16AG and 16AB made of the above-described material are each formed in the region surrounded by the upper partition walls 15B as illustrated in FIG. 11B (step S104). These hole injection layers 16AR, 16AG and 16AB are formed by a coating method such as ink jet, nozzle printing, letterpress printing, gravure printing or reverse offset printing. In particular, because it is necessary to selectively place the material forming the hole injection layers 16AR, 16AG and 16AB in the regions surrounded by the upper partition walls 15B, the ink jet method or nozzle printing method, each of which is a drop discharge method, should preferably be used.

More specifically, the solution or dispersed liquid of the material forming the hole injection layers 16AR, 16AG and 16AB such as polyaniline or polythiophene is placed on the exposed surfaces of the lower electrodes 14, for example, by the ink jet method. Then, the solution or dispersed liquid is heated (dried), thus forming the hole injection layers 16AR, 16AG and 16AB.

During the heat treatment, the solvent or dispersion medium is dried and then heated to high temperatures. If a conductive high molecular weight compound such as polyaniline or polythiophene is used, air or oxygen atmosphere is preferred. The reason for this is that conductivity is more likely to manifest itself as a result of the oxidation of the conductive high molecular weight compound by oxygen.

The heating temperature should preferably be 150° C. to 300° C., and more preferably be 180° C. to 250° C. Although depending on the temperature and atmosphere, the heating time should preferably be 5 to 300 minutes and more preferably be 10 to 240 minutes. The film thickness after the drying should preferably be 5 nm to 100 nm, and more preferably be 8 nm to 50 nm.

(Step of Forming the Hole Transport Layers 16BR, 16BG and 16BB)

Figure 11C:
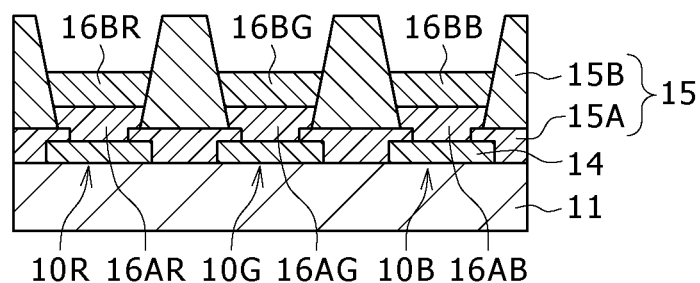

After the formation of the hole injection layers 16AR, 16AG and 16AB, the hole transport layers 16BR, 16BG and 16BB made of the above-described high molecular weight compound are formed respectively on the hole injection layers 16AR, 16AG and 16AB respectively for the red, green and blue organic EL elements 10R, 10G and 10B as illustrated in FIG. 11C (step S105). These hole transport layers 16BR, 16BG and 16BB are formed by a coating method such as ink jet, nozzle printing, letterpress printing, gravure printing or reverse offset printing. In particular, because it is necessary to selectively place the material forming the hole transport layers 16BR, 16BG and 16BB in the regions surrounded by the upper partition walls 15B, the ink jet method or nozzle printing method, each of which is a drop discharge method, should preferably be used.

More specifically, the solution or dispersed liquid of the material forming the hole transport layers 16BR, 16BG and 16BB is placed on the exposed surfaces of the hole injection layers 16AR, 16AG and 16AB, for example, by the ink jet method. Then, the solution or dispersed liquid is heated (dried), thus forming the hole transport layers 16BR, 16BG and 16BB.

During the heat treatment, the solvent or dispersion medium is dried and then heated to high temperatures. It is preferred that the atmosphere or solvent to be applied should be heated in an atmosphere whose chief component is nitrogen ($N_2$). The presence of oxygen or moisture may lead to reduced light emission efficiency or life of the manufactured organic EL display device. Oxygen and moisture have significant impact on the heating process in particular. Therefore, caution is necessary. The oxygen concentration should preferably be 0.1 ppm to 100 ppm and more preferably be 50 ppm or less. If the oxygen concentration is greater than 100 ppm, the interfaces between the formed thin films may be contaminated, possibly resulting in reduced light emission efficiency or life of the obtained organic EL display device. On the other hand, the oxygen concentration of less than 0.1 ppm is not problematic in terms of the element characteristics. In the currently available volume production process, however, the equipment cost adapted to maintain the oxygen concentration at less than 0.1 ppm may become excessive.

As for moisture, on the other hand, the dew point should preferably be −80° C. to −40° C., more preferably be −50° C. or less, and still more preferably be −60° C. or less. If moisture having a dew point higher than −40° C. is present, the interfaces between the formed thin films may be contaminated, possibly resulting in reduced light emission efficiency or life of the obtained organic EL display device. On the other hand, moisture having a dew point of less than −80° C. is not problematic in terms of the element characteristics. In the currently available volume production process, however, the equipment cost adapted to maintain the moisture dew point at less than −80° C. may become excessive.

The heating temperature should preferably be 100° C. to 230° C., and more preferably be 100° C. to 200° C. It is preferred that the heating temperature should be at least lower than the temperature at which the hole injection layers 16AR, 16AG and 16AB were formed. Although depending on the temperature and atmosphere, the heating time should preferably be 5 to 300 minutes and more preferably be 10 to 240 minutes. The film thickness after the drying should preferably be 10 nm to 200 nm, and more preferably be 15 nm to 150 nm.

(Step of Forming the Red and Green Light-Emitting Layers 16CR and 16CG)

After the formation of the hole transport layers 16BR, 16BG and 16BB, the red light-emitting layer 16CR made of the above-described high molecular weight compound is formed on the hole transport layer 16BR of the red organic EL element. Further, the green light-emitting layer 16CG made of the above-described high molecular weight compound is formed on the hole transport layer 16BG of the green organic EL element (step S106). The red and green light-emitting layers 16CR and 16CG are formed by a coating method such as ink jet, nozzle printing, letterpress printing, gravure printing or reverse offset printing. In particular, because it is necessary to selectively place the material forming the red and green light-emitting layers 16CR and 16CG in the regions surrounded by the upper partition walls 15B, the ink jet method or nozzle printing method, each of which is a drop discharge method, should preferably be used.

More specifically, the solution or dispersed liquid of the material forming the red and green light-emitting layers 16CR and 16CG such as a high molecular weight polymer is placed on the exposed surfaces of the hole transport layers 16BR and 16BG, for example, by the ink jet method. Then, the solution or dispersed liquid is heated (dried), thus forming the red and green light-emitting layers 16CR and 16CG.

During the heat treatment, the solvent or dispersion medium is dried and then heated to high temperatures. It is preferred that the atmosphere or solvent to be applied should be heated in an atmosphere whose chief component is nitrogen ($N_2$). The presence of oxygen or moisture may lead to reduced light emission efficiency or life of the manufactured organic EL display device. Oxygen and moisture have significant impact on the heating process in particular. Therefore, caution is necessary. The oxygen concentration should preferably be 0.1 ppm to 100 ppm and more preferably be 50 ppm or less. If the oxygen concentration is greater than 100 ppm, the interfaces between the formed thin films may be contaminated, possibly resulting in reduced light emission efficiency or life of the obtained organic EL display device. On the other hand, the oxygen concentration of less than 0.1 ppm is not problematic in terms of the element characteristics. In the currently available volume production process, however, the equipment cost adapted to maintain the oxygen concentration at less than 0.1 ppm may become excessive.

As for moisture, on the other hand, the dew point should preferably be −80° C. to −40° C., more preferably be −50° C. or less, and still more preferably be −60° C. or less. If moisture having a dew point higher than −40° C. is present, the interfaces between the formed thin films may be contaminated, possibly resulting in reduced light emission efficiency or life of the obtained organic EL display device. On the other hand, moisture having a dew point of less than −80° C. is not problematic in terms of the element characteristics. In the currently available volume production process, however, the equipment cost adapted to maintain the moisture dew point at less than −80° C. may become excessive.

The heating temperature should preferably be 100° C. to 230° C., and more preferably be 100° C. to 200° C. It is preferred that the heating temperature should be at least lower than the temperature at which the hole injection layers 16AR, 16AG and 16AB were formed. Although depending on the temperature and atmosphere, the heating time should preferably be 5 to 300 minutes and more preferably be 10 to 240 minutes. Although depending on the overall element structure, the film thickness after the drying should preferably be 10 nm to 200 nm, and more preferably be 15 nm to 150 nm.

Here, each of the red and green organic EL elements 10R and 10G is adjacent to the blue organic EL elements 10B in the same or adjacent pixel 10 at least on its two sides opposed to each other. This suppresses non-uniform drying speed of the applied solution on the sides adjacent to the blue organic EL elements 10B, thus providing reduced imbalance in thickness of the red and green light-emitting layers 16CR and 16CG after drying. Therefore, improved uniformity or symmetry can be achieved in the thickness of the red and green light-emitting layers 16CR and 16CG.

In the first example shown in FIG. 4 and second example shown in FIG. 5, for example, the blue organic EL element 10B in a strip form is arranged between the red and green organic EL elements 10R and 10G. Each of the red and green organic EL elements 10R and 10G is adjacent to the blue organic EL elements 10B in the same or adjacent pixel on its two long sides. This suppresses non-uniform drying speed of the applied solution on the long sides of each of the red and green organic EL elements 10R and 10G, thus providing reduced imbalance in thickness of the red and green light-emitting layers 16CR and 16CG after drying. Therefore, improved uniformity or symmetry can be achieved in the horizontal (direction parallel to the short sides) film thickness distribution in FIG. 4 or 5.

In the third example shown in FIG. 6, the red and green organic EL elements 10R and 10G are arranged in a staggered fashion. Each of the red and green organic EL elements 10R and 10G is adjacent to the blue organic EL elements 10B in the same or adjacent pixel 10 on its all four sides. This suppresses non-uniform drying speed of the applied solution on all the four sides of each of the red and green organic EL elements 10R and 10G, thus providing reduced imbalance in thickness of the red and green light-emitting layers 16CR and 16CG after drying. Therefore, improved uniformity or symmetry can be achieved in not only the horizontal but also vertical film thickness distributions in FIG. 6, thus making this arrangement the most advantageous of all.

In the fourth example shown in FIG. 7 and fifth example shown in FIG. 8 and sixth example shown in FIG. 9, the red and green organic EL elements 10R and 10G are arranged in one direction. Each of the red and green organic EL elements 10R and 10G is adjacent to the blue organic EL elements 10B in the same or adjacent pixel 10 on its upper and lower sides. This suppresses non-uniform drying speed of the applied solution on the upper and lower sides of each of the red and green organic EL elements 10R and 10G, thus providing reduced imbalance in thickness of the red and green light-emitting layers 16CR and 16CG after drying. Therefore, improved uniformity or symmetry can be achieved in the vertical film thickness distribution in FIG. 7 or 8.

Figure 11D:
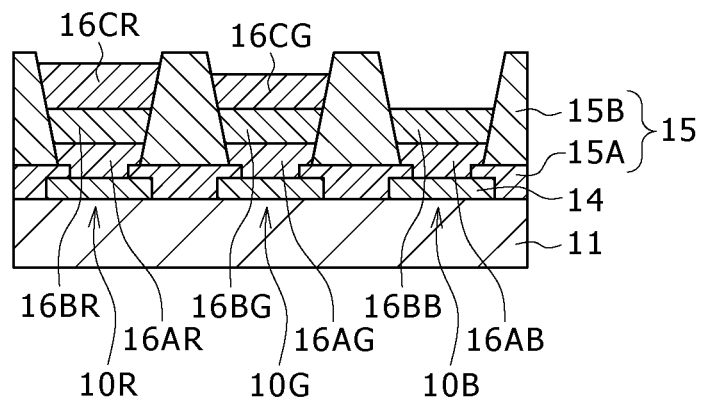
FIGS. 11D and 11E are continued from FIG. 11C and sectional views illustrating the process steps.
Figure 11E:
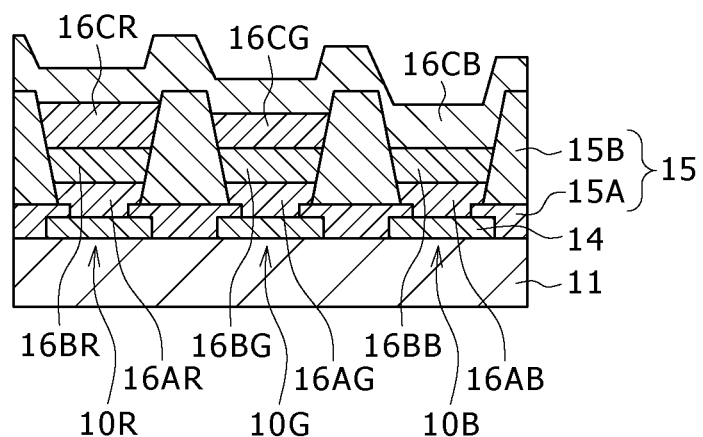

In contrast, red, green and blue organic EL elements 810R, 810G and 810B have been hitherto arranged in this order as illustrated in FIG. 12A. Therefore, the drying speed of the applied solution is high on the sides of red and green light-emitting layers 816CR and 816CG adjacent to the blue organic EL element 810B, thus drawing the undried ink to the dried ink because of the so-called coffee stain phenomenon. This leads to thickening of the sides adjacent to the blue organic EL elements 810B, thus resulting in poor uniformity or symmetry in the film thickness distribution. The term "coffee stain phenomenon" refers to a phenomenon in which the liquid film that has spread across the substrate evaporates more at its outer edge or periphery than any other regions. In order to make up for the loss, the liquid flows toward the periphery, thus forming a film with a swelling periphery after the drying. It should be noted that, in FIGS. 12A to 12B, the same components as those in FIGS. 11D to 11E are designated by reference numerals in the 800 series.

A possible countermeasure to avoid this situation would be to apply only the solvent to the blue organic EL element 810B so as to even out the drying speed. However, it is necessary to increase the number of heads of the coater, thus resulting in increased cost.

On the other hand, the blue organic EL element 810B has a shorter light emission life than the red and green organic EL elements 810R and 810G because of the material problem. Therefore, it is necessary for the blue organic EL element 810B to be larger in area than the red and green organic EL elements 810R and 810G for longer service life. In this case, however, uneven drying is more likely, thus resulting in uneven film thickness caused by the coffee stain phenomenon described with reference to FIG. 12B.

(Step of Forming the Blue Light-Emitting Layer 16CB)

After the formation of the hole transport layer 16BB of the blue organic EL element 10B and the red and green light-emitting layers 16CR and 16CG, the blue light-emitting layer 16CB made of the above-described low molecular weight material is formed over the entire surfaces of the red and green light-emitting layers 16CR and 16CG and the hole transport layer 16BB of the blue organic EL element 10B by a vapor deposition method as illustrated in FIG. 11E (step S109).

(Step of Forming the Electron Transport Layer 16E, Electron Injection Layer 16F and the Upper Electrode 17)

Figure 11F:
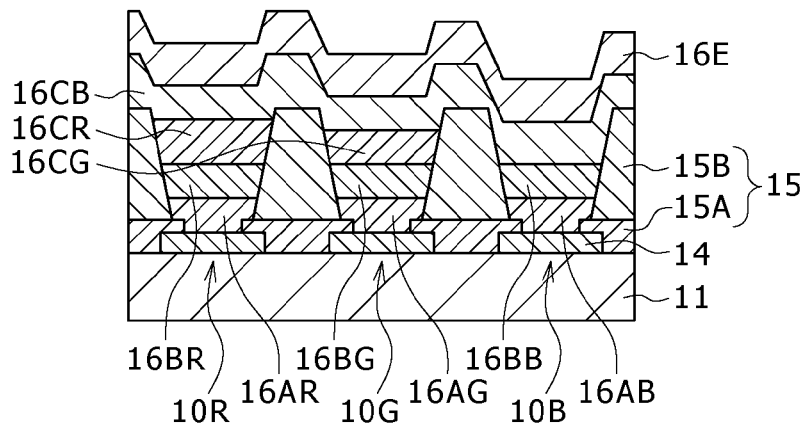
FIGS. 11F to 11H are continued from FIG. 11E and sectional views illustrating the process steps.
Figure 11G:
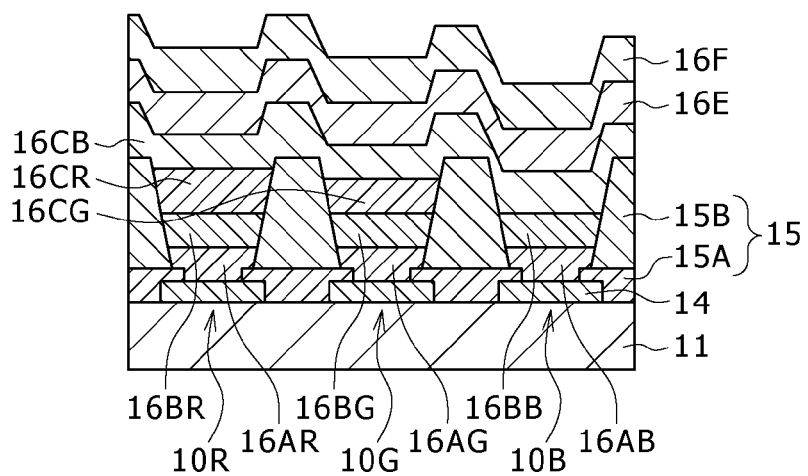
Figure 11H:
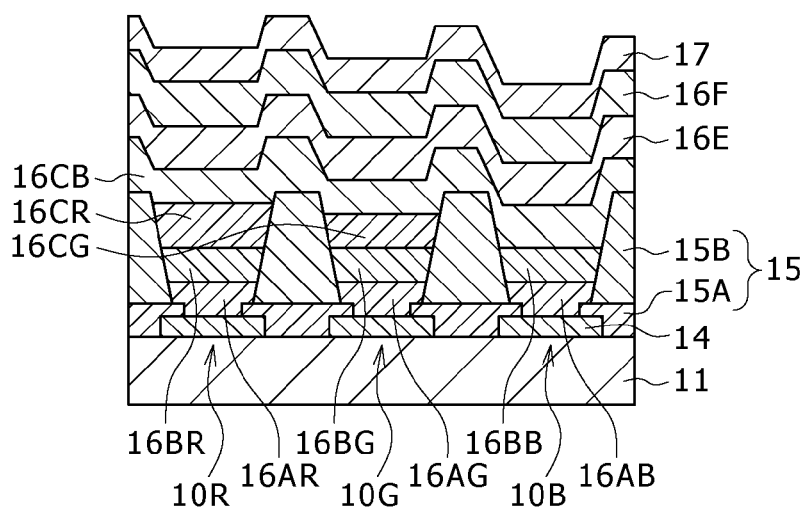

After the formation of the blue light-emitting layer 16CB, the electron transport layer 16E, electron injection layer 16F and upper electrode 17 made of the above-described materials are formed over the entire surface of the blue light-emitting layer 16CB by a vapor deposition method as illustrated in FIGS. 11F to 11H (steps S110 to S112).

After the formation of the upper electrode 17, the protective layer 20 is formed by a film forming method such as vapor deposition or CVD in which the energy of the particles of the formed film is small to the extent that the underlying layers are not adversely affected. For example, if the protective layer 20 made of amorphous silicon nitride is formed, the same layer 20 is formed to the thickness of 2 to 3 μm by CVD. At this time, it is preferred to set the film forming temperature of the protective layer 20 at room temperature so as to prevent the reduction of luminance due to the deterioration of the organic layer 16. It is also preferred to form the protective layer 20 under the conditions that provide the smallest possible stress on the film so as to prevent the peeling of the protective layer 20.

The blue light-emitting layer 16CB, electron transport layer 16E, electron injection layer 16F, upper electrode 17 and protective layer 20 are each formed over the entire surface in the form of a solid film without using any mask. Further, the blue light-emitting layer 16CB, electron transport layer 16E, electron injection layer 16F, upper electrode 17 and protective layer 20 are desirably formed successively in the same film forming equipment without being exposed to the atmosphere. This prevents the deterioration of the organic layer 16 caused by moisture in the atmosphere.

It should be noted that if an auxiliary electrode (not shown) is formed in the same process step as for the lower electrodes 14, the organic layer 16 formed in the form of a solid film on the auxiliary electrode may be removed by laser abrasion or other technique before forming the upper electrode 17. This allows for the upper electrode 17 to be directly connected to the auxiliary electrode, thus providing improved contact.

After the formation of the protective layer 20, a light-shielding film made of the above-described material is, for example, formed on the sealing substrate 40 made of the above-described material. Next, the material of a red filter (not shown) is applied to the sealing substrate 40, for example, by spin coating. Next, blue and green filters (not shown) are sequentially formed in the same manner as for the red filter (not shown).

Then, an adhesive layer (not shown) is formed on the protective layer 20. Finally, the sealing substrate 40 is attached to the protective film 20 with the adhesive layer sandwiched therebetween. This completes the display device shown in FIGS. 1 to 3.

In this organic EL display device, a scan signal is supplied to each pixel from the scan line drive circuit 130 via the gate electrode of the write transistor Tr2. Further, a pixel signal supplied from the signal line drive circuit 120 via the write transistor Tr2 is held by the holding capacitor Cs. That is, the drive transistor Tr1 is controlled to turn ON or OFF according to the signal held by the holding capacitor Cs, thus injecting a drive current Id into the red, green and blue organic EL elements 10R, 10G and 10B and allowing the holes and electrons to recombine for light emission. This light transmits through the lower electrodes 14 and substrate 11 before being extracted when the organic EL display device is a bottom emission type. The light transmits through the upper electrode 17, color filter (not shown) and sealing substrate 40 before being extracted when the organic EL display device is a top emission type.

At this time, the red light-emitting layer 16CR and blue light-emitting layer 16CB are provided in the red organic EL element 10R. In the same element 10R, energy transfer occurs in red, the color at the lowest energy level, thus making the red light emission predominant. The green and blue light-emitting layers 16CG and 16CB are provided in the green organic EL element 10G. In the same element 10G, energy transfer occurs in green, the color at a lower energy level of the two, thus making the green light emission predominant. The blue organic EL element 10B includes only the blue light-emitting layer 16CB, thus allowing blue light emission to take place. Here, each of the red and green organic EL elements 10R and 10G is adjacent to the blue organic EL elements 10B in the same or adjacent pixel at least on its two sides opposed to each other. This suppresses non-uniform drying speed of the applied solution on the sides adjacent to the first organic EL elements in the manufacturing process, thus providing reduced imbalance in thickness of the red and green light-emitting layers 16CR and 16CG after drying. Therefore, improved uniformity or symmetry can be achieved in the thickness of the red and green light-emitting layers 16CR and 16CG, thus contributing to a practically larger light emission area and providing longer light emission life.

As described above, in the present embodiment, each of the red and green organic EL elements 10R and 10G is adjacent to the blue organic EL elements 10B in the same or adjacent pixel at least on its two sides opposed to each other. This ensures improved uniformity or symmetry in the thickness of the red and green light-emitting layers 16CR and 16CG, thus contributing to a practically larger light emission area and providing longer light emission life.

Further, when the blue organic EL element 10B is designed to be larger in area than the red and green organic EL elements 10R and 10G, it is possible to suppress the imbalance in thickness of the red and green light-emitting layers 16CR and 16CG. This makes it possible to strike a balance with the red and green organic EL elements 10R and 10G in terms of light emission life by increasing the area of the blue organic EL element 10B.

Second to Fifth Embodiments

A description will be given below of second to fifth embodiments. Each of these embodiments relates to an element structure that particularly enhances the advantageous effect of the pixel arrangement described in the first embodiment with reference to FIGS. 4 to 9. On the other hand, the same components as those in the first embodiment are denoted by the same reference numerals, and the description thereof is omitted.

Second Embodiment

The second embodiment is identical in configuration to the first embodiment except that a low molecular weight material is included in the hole transport layer 16BB of the blue organic EL element 10B to provide improved blue light emission efficiency and longer life. Here, the term "low molecular weight material" means a substance other than those made of molecules of a high molecular weight polymer or condensate generated as a result of the repetition of the same or similar reactions of a low molecular weight compound in a chain-like manner, and refers to a compound practically having a single molecular weight. Further, heating does not practically generate any new chemical bond between molecules. Therefore, a low molecular weight material exists in the form of a single molecule.

Among specific materials that can be used as the hole transport layer 16BB are benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and their derivatives, and heterocyclic conjugated monomers, oligomers or polymers such as polysilane-based compounds, vinylcarbazole-based compounds, thiophene-based compounds or aniline-based compounds.

Among more specific materials that can be used are α-naphthylphenylphenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methyl phenyl phenyl amino) triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene) and poly(2,2'-thienylpyrrol). However, the materials that can be used are not limited thereto.

This organic EL display device can be manufactured, for example, in the following manner.

Figure 13:
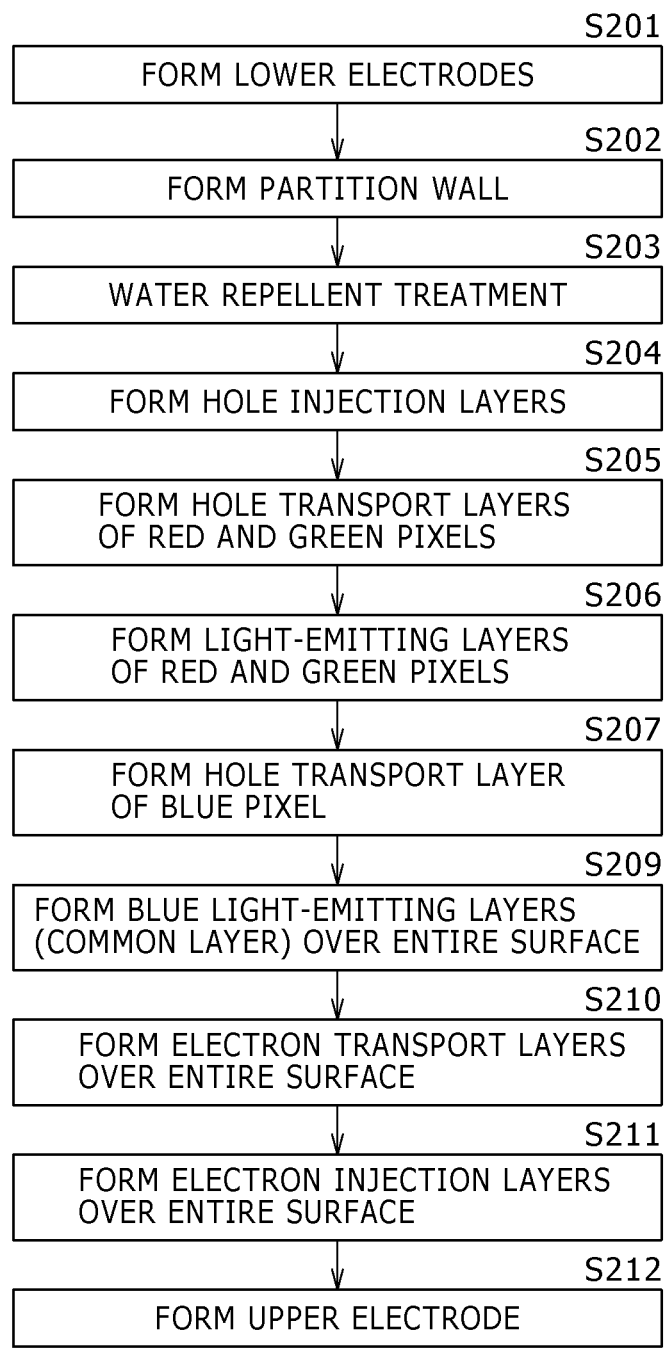
FIG. 13 is a diagram illustrating the flow of the manufacturing method of the organic EL display device according to a second embodiment of the present disclosure.

FIG. 13 is a diagram illustrating the flow of the manufacturing method of the organic EL display device according to the present embodiment. FIGS. 14A to 14I illustrate the manufacturing method shown in FIG. 13 in the order of execution of the process steps.

(Step of Forming the Lower Electrodes 14)

Figure 14A:
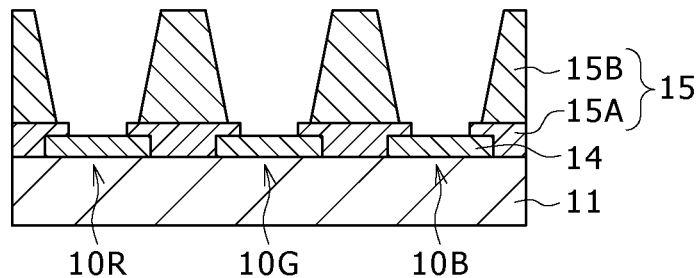
FIGS. 14A to 14C are sectional views illustrating the manufacturing method shown in FIG. 13 in the order of execution of the process steps.

First, the lower electrodes 14 are formed on the substrate 11 on which the pixel drive circuits 140 and a planarizing insulating film have been formed as illustrated in FIG. 14A in the same manner as in the first embodiment (step S201).

(Step of Forming the Partition Wall 15)

Next, the partition wall 15 made up of the lower and upper partition walls 15A and 15B is formed as illustrated in FIG. 14A in the same manner as in the first embodiment (step S202).

(Step of Performing Water Repellent Treatment)

Next, oxygen plasma treatment is performed on the side of the substrate 11 on which the lower electrodes 14 and partition wall 15 have been formed, followed by water repellent treatment (liquid repellent treatment) in the same manner as in the first embodiment (step S203), thus providing reduced wettability of the top and side surfaces of the upper partition walls 15B in particular.

(Step of Forming the Hole Injection Layers 16AR, 16AG and 16AB)

Figure 14B:
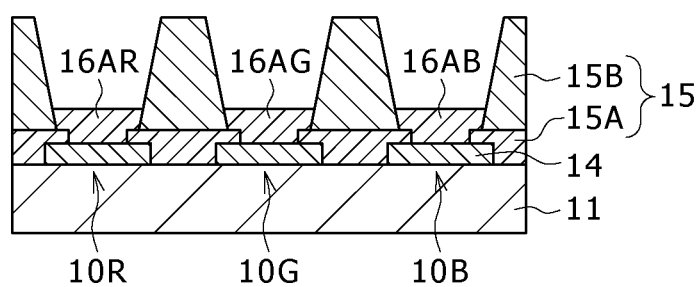

Then, the hole injection layers 16AR, 16AG and 16AB made of the above-described material are formed in the regions surrounded by the upper partition walls 15B as illustrated in FIG. 14B in the same manner as in the first embodiment (step S204).

(Step of Forming the Hole Transport Layers 16BR and 16BG)

Figure 14C:
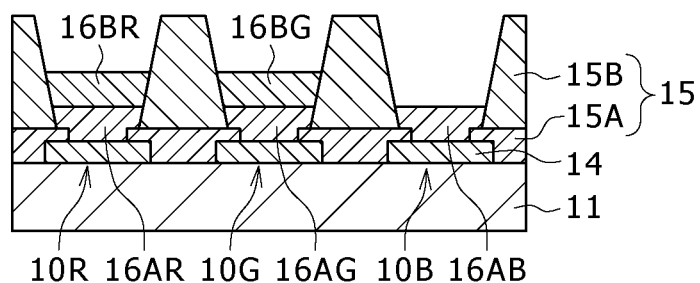

After the formation of the hole injection layers 16AR, 16AG and 16AB, the hole transport layers 16BR and 16BG made of the above-described high molecular weight material are formed respectively on the hole injection layers 16AR and 16AG respectively for the red and green organic EL elements 10R and 10G as illustrated in FIG. 14C in the same manner as in the first embodiment (step S205).

Here, each of the red and green organic EL elements 10R and 10G is adjacent to the blue organic EL elements 10B in the same or adjacent pixel 10 at least on its two sides opposed to each other. This suppresses non-uniform drying speed of the applied solution on the sides adjacent to the blue organic EL elements 10B, thus providing reduced imbalance in thickness of the red and green light-emitting layers 16BR and 16BG after drying as in the first embodiment. Therefore, improved uniformity or symmetry can be achieved in the thickness of the red and green light-emitting layers 16BR and 16BG.

(Step of Forming the Red and Green Light-Emitting Layers 16CR and 16CG)

Figure 14D:
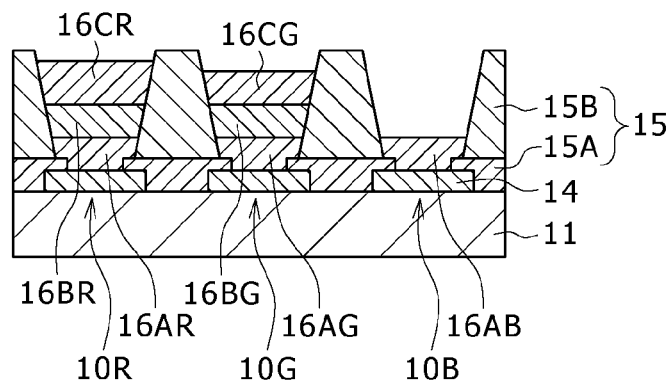
FIGS. 14D to 14F are continued from FIG. 14C and sectional views illustrating the process steps.

After the formation of the hole transport layers 16BR and 16BG, the red light-emitting layer 16CR made of the above-described high molecular weight compound is formed on the hole transport layer 16BR of the red organic EL element 10R as illustrated in FIG. 14D in the same manner as in the first embodiment. Further, the green light-emitting layer 16CG made of the above-described high molecular weight compound is formed on the hole transport layer 16BG of the green organic EL element 10G (step S206).

Here again, each of the red and green organic EL elements 10R and 10G is adjacent to the blue organic EL elements 10B in the same or adjacent pixel 10 at least on its two sides opposed to each other. This suppresses non-uniform drying speed of the applied solution on the sides adjacent to the blue organic EL elements 10B, thus providing reduced imbalance in thickness of the red and green light-emitting layers 16CR and 16CG after drying as in the first embodiment. Therefore, improved uniformity or symmetry can be achieved in the thickness of the red and green light-emitting layers 16CR and 16CG.

(Step of Forming the Hole Transport Layer 16BB of the Blue Organic EL Element 10B)

Figure 14E:
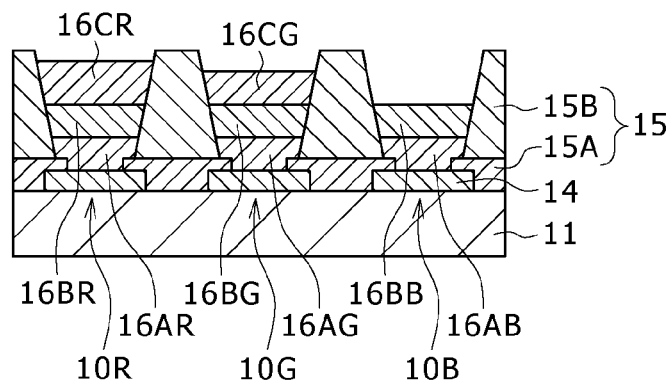

After the formation of the red and green light-emitting layers 16CR and 16CG, the hole transport layer 16BB made of the above-described low molecular weight material is formed on the hole injection layer 16AB of the blue organic EL element 10B as illustrated in FIG. 14E (step S207). The hole transport layer 16BB is formed by a coating method such as ink jet, nozzle printing, letterpress printing, gravure printing or reverse offset printing. In particular, because it is necessary to selectively place the material forming the hole transport layer 16BB in the regions surrounded by the upper partition walls 15B, the ink jet method or nozzle printing method, each of which is a drop discharge method, should preferably be used.

More specifically, the solution or dispersed liquid of the low molecular weight material forming the hole transport layer 16BB is placed on the exposed surface of the hole injection layer 16AB, for example, by the ink jet method. Then, the solution or dispersed liquid is heated (dried), thus forming the hole transport layer 16BB.

During the heat treatment, the solvent or dispersion medium is dried and then heated to high temperatures. It is preferred that the atmosphere or solvent to be applied should be heated in an atmosphere whose chief component is nitrogen ($N_2$). The presence of oxygen or moisture may lead to reduced light emission efficiency or life of the manufactured organic EL display device. Oxygen and moisture have significant impact on the heating process in particular. Therefore, caution is necessary. The oxygen concentration should preferably be 0.1 ppm to 100 ppm and more preferably be 50 ppm or less. If the oxygen concentration is greater than 100 ppm, the interfaces between the formed thin films may be contaminated, possibly resulting in reduced light emission efficiency or life of the obtained organic EL display device. On the other hand, the oxygen concentration of less than 0.1 ppm is not problematic in terms of the element characteristics. In the currently available volume production process, however, the equipment cost adapted to maintain the oxygen concentration at less than 0.1 ppm may become excessive.

As for moisture, on the other hand, the dew point should preferably be −80° C. to −40° C., more preferably be −50° C. or less, and still more preferably be −60° C. or less. If moisture having a dew point higher than −40° C. is present, the interfaces between the formed thin films may be contaminated, possibly resulting in reduced light emission efficiency or life of the obtained organic EL display device. On the other hand, moisture having a dew point of less than −80° C. is not problematic in terms of the element characteristics. In the currently available volume production process, however, the equipment cost adapted to maintain the moisture dew point at less than −80° C. may become excessive.

The heating temperature should preferably be 100° C. to 230° C., and more preferably be 100° C. to 200° C. It is preferred that the heating temperature should be at least lower than the temperature at which the hole injection layers 16AR, 16AG and 16AB were formed. On the other hand, continued heating at a temperature far beyond the glass transition temperature Tg of the low molecular weight material may lead to significantly degraded characteristics. Although depending on the temperature and atmosphere, the heating time should preferably be 5 to 300 minutes and more preferably be 10 to 240 minutes. The film thickness after the drying should preferably be 10 nm to 200 nm, and more preferably be 15 nm to 150 nm.

(Order of the Steps)

The step of forming the hole transport layers 16BR and 16BG of the red and green organic EL elements 10R and 10G, that of forming the hole transport layer 16BB of the blue organic EL element 10B and that of forming the red and green light-emitting layers 16CR and 16CG may be performed in any order. However, it is at least necessary that an underlying layer on which the target layer is to be formed should be formed in advance and that the underlying layer should have undergone the heating process including heating and drying. Further, it is necessary to apply these layers so that the heating temperature is equal to or lower than that in the previous step. For example, if the heating temperature of the red and green light-emitting layers 16CR and 16CG is 130° C. and that of the hole transport layer 16BB of the blue organic EL element 10B is the same temperature or 130° C., the red and green light-emitting layers 16CR and 16CG may be applied, followed, without drying, by the application of the hole transport layer 16BB of the blue organic EL element 10B, which is followed by the drying and heating of the red and green light-emitting layers 16CR and 16CG and the hole transport layer 16BB of the blue organic EL element 10B.

On the other hand, it is preferred to perform drying and heating as two separate steps. The reason for this is that uneven film thickness is likely because the applied wet film is significantly fluid during the drying process. It is preferred that the film should be dried through uniform vacuum drying at a normal pressure, and more preferred that the film should be dried with no currents of air. During the heating process, the solvent has evaporated to a certain extent. As a result, the film is hard and less fluid. By heating the film in this state slowly, it is possible to remove the solvent existing in trace amounts and allow for the rearrangement of the light-emitting material and that of the hole transport layers at the molecular level.

(Step of Forming the Blue Light-Emitting Layer 16CB)

Figure 14F:
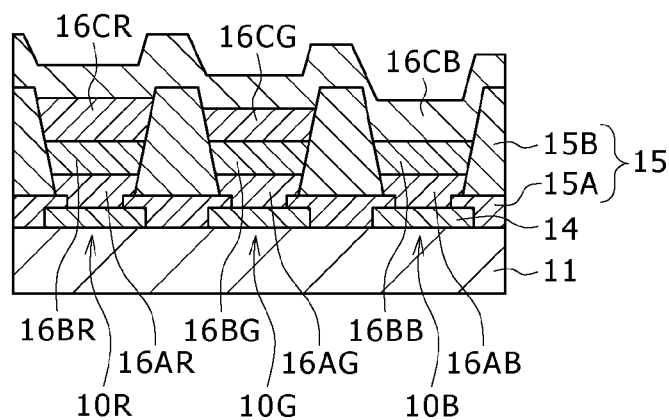

After the formation of the hole transport layer 16BB of the blue organic EL element 10B and the red and green light-emitting layers 16CR and 16CG, the blue light-emitting layer 16CB made of the above-described low molecular weight material is formed, as a common layer, over the entire surfaces of the red and green light-emitting layers 16CR and 16CG and the hole transport layer 16BB of the blue organic EL element 10B by vapor deposition as illustrated in FIG. 14F in the same manner as in the first embodiment (step S209).

(Step of Forming the Electron Transport Layer 16E, Electron Injection Layer 16F and Upper Electrode 17)

Figure 14G:
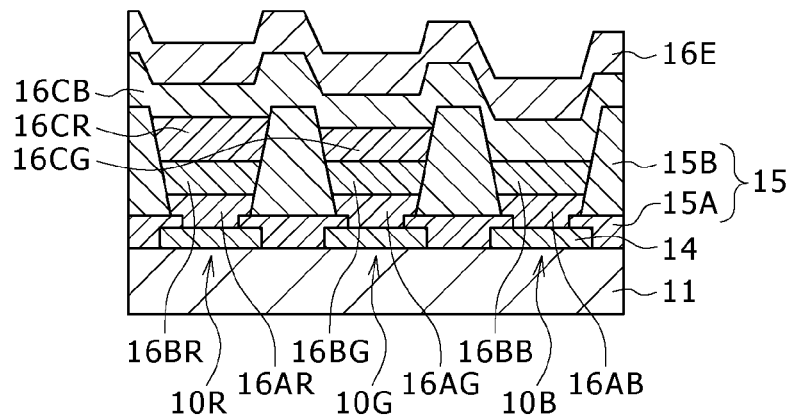
FIGS. 14G to 14I are continued from FIG. 14F and sectional views illustrating the process steps.
Figure 14H:
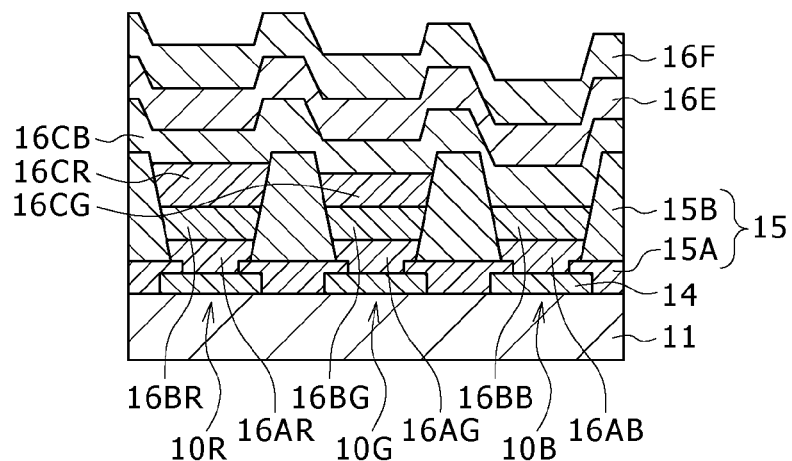
Figure 14I:
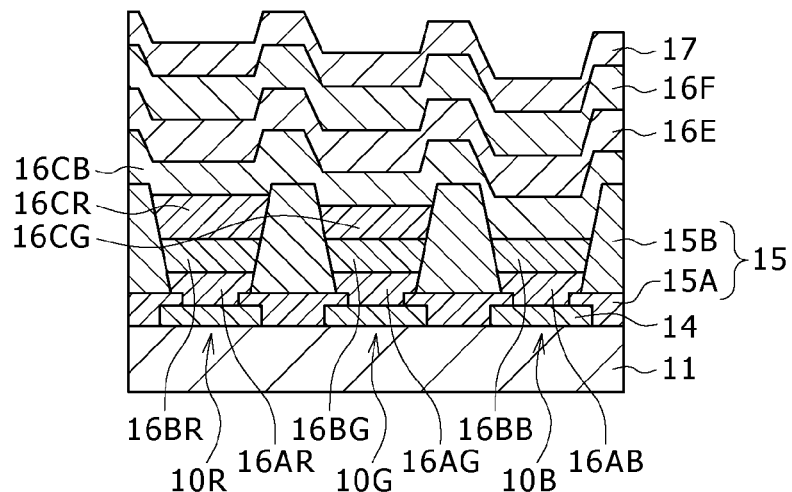

After the formation of the blue light-emitting layer 16CB, the electron transport layer 16E, electron injection layer 16F and upper electrode 17 made of the above-described materials are formed over the entire surface of the blue light-emitting layer 16CB by a vapor deposition method as illustrated in FIGS. 14G to 14I in the same manner as in the first embodiment (steps S210 to S212).

After the formation of the upper electrode 17, the protective layer 20 is formed as illustrated in FIG. 3 in the same manner as in the first embodiment. Further, a light-shielding film and red, blue and green filters (not shown) are sequentially formed on the sealing substrate 40 made of the above-described material.

Then, an adhesive layer (not shown) is formed on the protective layer 20, and the sealing substrate 40 is attached to the protective film 20 with the adhesive layer provided therebetween. This completes the display device shown in FIGS. 1 to 3.

In this organic EL display device, the driving of the pixels is controlled in the same manner as in the first embodiment. As a result, the drive current Id is injected into the red, green and blue organic EL elements 10R, 10G and 10B, allowing for the holes and electrons to recombine for light emission. This light transmits through the lower electrodes 14 and substrate 11 before being extracted when the organic EL display device is a bottom emission type. The light transmits through the upper electrode 17, color filter (not shown) and sealing substrate 40 before being extracted when the organic EL display device is a top emission type.

At this time, the red and blue light-emitting layers 16CR and 16CB are provided in the red organic EL element 10R. In the same element 10R, energy transfer occurs in red, the color at the lowest energy level, thus making the red light emission predominant. The green and blue light-emitting layers 16CG and 16CB are provided in the green organic EL element 10G. In the same element 10G, energy transfer occurs in green, the color at a lower energy level of the two, thus making the green light emission predominant. The blue organic EL element 10B includes only the blue light-emitting layer 16CB, thus allowing blue light emission to take place. Here, the hole transport layer 16BB of the blue organic EL element 10B is made of a low molecular weight material. This contributes to improved condition of the interface with the blue light-emitting layer 16CB made of a low molecular weight material, thus providing improved blue light emission efficiency and life.

As described above, the hole transport layer 16BB made of a low molecular weight material is formed on the hole injection layer 16AB of the blue organic EL element 10B by a coating method in the present embodiment. Therefore, the present embodiment contributes to improved condition of the interface with the blue light-emitting layer 16CB made of a low molecular weight material for improved blue light emission efficiency and life in addition to the advantageous effect achieved by the first embodiment. This provides even higher light emission efficiency and longer life of the color organic EL display device having the red, green and blue organic EL elements 10R, 10G and 10B arranged and formed therein. Further, the second embodiment resolves the difficulty in patterning and contributes to lower cost of the printing process at the same time.

Third Embodiment

The third embodiment is identical in configuration to the second embodiment except that a low molecular weight material is included in the red and green light-emitting layers 16CR and 16CG.

The red and green light-emitting layers 16CR and 16CG are made of a mixture of two materials, a high molecular weight (light-emitting) material and a low molecular weight material added thereto. As a result, the present embodiment provides improved hole and electron injection efficiencies from the blue light-emitting layer 16CB serving as a common layer to the red or green light-emitting layer 16CR or 16CG. Here, the term "low molecular weight material" refers to a monomer or oligomer obtained by bonding two to 10 of this monomer together. A low molecular weight material having a weight-average molecular weight of 50000 or less is preferred. It should be noted that low molecular weight materials having a weight-average molecular weight beyond the above level are not necessarily excluded.

The red and green light-emitting layers 16CR and 16CG are formed, for example, by a coating method such as the ink jet method. At this time, the high and low molecular weight materials are dissolved using one or more organic solvents including toluene, xylene, anisole, cyclohexane, mesitylene (1,3,5-trimethylbenzene), pseudocumene(1,2,4-trimethylbenzene), dihydro-benzofuran, 1,2,3,4-tetramethylbenzene, tetralin, cyclohexylbenzene, 1-methylnaphthalene, p-anisyl alcohol, dimethylnaphtalene, 3-methyl biphenyl, 4-methyl biphenyl, 3-isopropyl biphenyl and monoisopropylnaphthalene. Then, the red and green light-emitting layers 16CR and 16CG are formed using this mixture solution.

Among the high molecular weight materials that can be used as the red and green light-emitting layers 16CR and 16CG are polyfluorene-based high molecular weight derivatives, (poly)paraphenylene vinylene derivatives, polyphenylene derivatives, polyvinylcarbazole derivatives, polythiophene derivatives, perylene-based dyes, coumarin-based dyes, rhodamine-based dyes and any of the above high molecular weight compounds doped with an organic EL material. On the other hand, rubrene, perylene, 9,10-diphenylanthracene, tetraphenylbutadiene, nile red or coumarin 6 can be used as a dopant.

A description will be given below of the principle behind the reason why the hole and electron injection efficiencies from the blue light-emitting layer 16CB serving as a common layer to the red or green light-emitting layer 16CR or 16CG improve as a result of addition of a low molecular weight material to the high molecular weight material of which the red and green light-emitting layers 16CR and 16CG are made.

In the first and second embodiments, the blue light-emitting layer 16CB made of a low molecular weight material is formed as a common layer on top of the red and green light-emitting layers 16CR and 16CG made only of a high molecular weight material. There is a large difference in energy level between the red and green light-emitting layers 16CR and 16CG and the blue light-emitting layer 16CB. This leads to a significantly low hole or electron injection efficiency between the blue light-emitting layer 16CB and each of the red and green light-emitting layers 16CR and 16CG, making it likely that the light-emitting layers made of a high molecular weight material may not be able to deliver its characteristics to a sufficient degree. In the present embodiment, a low molecular weight material (monomer or oligomer) is added to the red and green light-emitting layers 16CR and 16CG so as to reduce the difference in energy level between the red and green light-emitting layers 16CR and 16CG and the blue light-emitting layer 16CB, thus providing improved hole or electron injection characteristic. Here, the relationship is considered between the highest occupied molecular orbital (HOMO) level and lowest occupied molecular orbital (LOMO) level of the red and green light-emitting layers 16CR and 16CG, the HOMO (highest occupied molecular orbital) level and the lowest unoccupied molecular orbital (LUMO) level of the blue light-emitting layer 16CB, and the HOMO (highest occupied molecular orbital) level and the lowest unoccupied molecular orbital (LUMO) level of the low molecular weight material added to the red and green light-emitting layers 16CR and 16CG. As a specific low molecular weight material to be added, a compound is selected that has a LUMO level lower than that of the red or green light-emitting layer 16CR or 16CG and higher than that of the blue light-emitting layer 16CB and that also has a HOMO level higher than that of the red or green light-emitting layer 16CR or 16CG and lower than that of the blue light-emitting layer 16CB.

On the other hand, the term "low molecular material added to the red and green light-emitting layers 16CR and 16CG" means a substance other than those made of molecules of a high molecular weight polymer or condensate generated as a result of the repetition of the same or similar reactions of a low molecular weight compound in a chain-like manner, and refers to a compound practically having a single molecular weight. Further, heating does not practically generate any new chemical bond between molecules. Therefore, the low molecular weight material exists in a single molecule. The weight-average molecular weight (Mw) of such a low molecular weight material should preferably be 50000. The reason for this is that a material having a molecular weight lower to a certain extent than 50000 offers more diverse characteristics, thus making it easier to adjust the hole or electron mobility, band gap or solubility to a solvent. On the other hand, the amount of addition of the low molecular weight material should preferably be such that the mixing ratio between the high molecular weight material used as the red or green light-emitting layer 16CR or 16CG and the low molecular weight material is from 10:1 to 1:2 in weight ratio.

The reason for this is that the effectiveness of addition of the low molecular weight material is smaller if the mixing ratio is less than 10:1. On the other hand, if the mixing ratio is greater than 1:2, it is difficult to obtain the characteristics of the high molecular weight material as a light-emitting material.

Among the materials that can be used as such a low molecular weight material are benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and their derivatives, and heterocyclic conjugated monomers, oligomers or polymers such as polysilane-based compounds, vinylcarbazole-based compounds, thiophene-based compounds or aniline-based compounds.

Among more specific materials that can be used are α-naphthylphenylphenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methyl phenyl phenyl amino) triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2'-thienylpyrrol). However, the materials that can be used are not limited thereto.

It should be noted that not only one but a plurality of low molecular weight materials may be mixed into the red and green light-emitting layers 16CR and 16CG.

This organic EL display device can be manufactured in the same manner as in the second embodiment.

In this organic EL display device, the driving of the pixels is controlled in the same manner as in the first embodiment. As a result, the drive current Id is injected into the red, green and blue organic EL elements 10R, 10G and 10B, allowing for the holes and electrons to recombine for light emission. This light transmits through the lower electrodes 14 and substrate 11 before being extracted when the organic EL display device is a bottom emission type. The light transmits through the upper electrode 17, color filter (not shown) and sealing substrate 40 before being extracted when the organic EL display device is a top emission type.

At this time, the red and blue light-emitting layers 16CR and 16CB are provided in the red organic EL element 10R. In the same element 10R, energy transfer occurs in red, the color at the lowest energy level, thus making the red light emission predominant. The green and blue light-emitting layers 16CG and 16CB are provided in the green organic EL element 10G. In the same element 10G, energy transfer occurs in green, the color at a lower energy level of the two, thus making the green light emission predominant. The blue organic EL element 10B includes only the blue light-emitting layer 16CB, thus allowing blue light emission to take place. As described earlier, in the first and second embodiments, the hole or electron injection efficiency from the blue light-emitting layer 16CB to the red or green light-emitting layer 16CR or 16CG is low, thus making it difficult for the same light-emitting layer 16CR or 16CG made of a high molecular weight material to deliver its original characteristics.

Here, a low molecular weight material is added to the high molecular weight material in the red and green light-emitting layers 16CR and 16CG, thus providing reduced difference in energy level with the blue light-emitting layer 16CB made of a low molecular weight material. This contributes to improved hole or electron injection efficiency from the blue light-emitting layer 16CB to the red or green light-emitting layer 16CR or 16CG, practically providing the values close to the element characteristics possessed by the red and green light-emitting layers 16CR and 16CG.

As described above, the red and green light-emitting layers 16CR and 16CG are formed with a mixture of high and low molecular weight materials by a coating method in the present embodiment. Therefore, the present embodiment contributes to improved hole or electron transfer efficiency from the blue light-emitting layer 16CB to the red or green light-emitting layer 16CR or 16CG in addition to the advantageous effect achieved by the first embodiment, thus providing the values close to the element characteristics possessed by the red and green light-emitting layers 16CR and 16CG. That is, the present embodiment provides even higher light emission efficiency and longer life of the color organic EL display device having the red, green and blue organic EL elements 10R, 10G and 10B arranged and formed therein.

Fourth Embodiment

Figure 15:
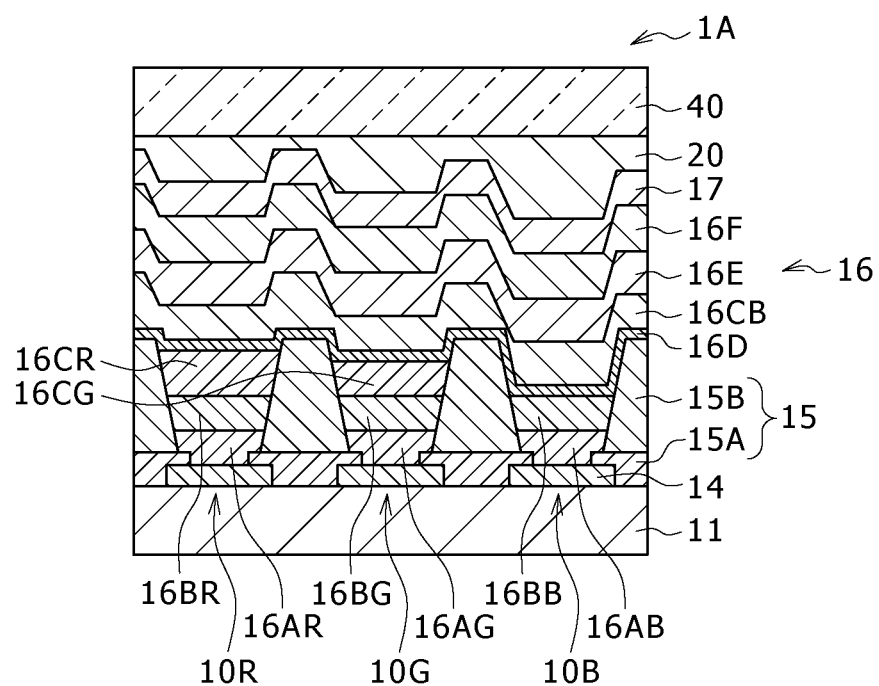
FIG. 15 is a sectional view illustrating the configuration of an organic EL display device according to a fourth embodiment of the present disclosure.

FIG. 15 illustrates the sectional configuration of the display region 110 of an organic EL display device 1A according to a fourth embodiment of the present disclosure. The organic EL display device 1A includes a common hole transport layer 16D made of a low molecular weight material between the entire surfaces of the red and green light-emitting layers 16CR and 16CG and the hole transport layer 16BB of the blue organic EL element 10B and the blue light-emitting layer 16CB. The organic EL display device 1A is identical in configuration to the counterpart according to the third embodiment except in this respect.

The organic layer 16 of the red organic EL element 10R includes, for example, the hole injection layer 16AR, hole transport layer 16BR, red light-emitting layer 16CR, common hole transport layer (second hole injection/transport layer) 16D, blue light-emitting layer 16CB, electron transport layer 16E and electron injection layer 16F that are stacked in this order from the side of the lower electrodes 14. The organic layer 16 of the green organic EL element 10G includes, for example, the hole injection layer 16AG, hole transport layer 16BG, green light-emitting layer 16CG, common hole transport layer 16D, blue light-emitting layer 16CB, electron transport layer 16E and electron injection layer 16F that are stacked in this order from the side of the lower electrodes 14. The organic layer 16 of the blue organic EL element 10B includes, for example, the hole injection layer 16AB, hole transport layer 16BB, common hole transport layer 16D, blue light-emitting layer 16CB, electron transport layer 16E and electron injection layer 16F that are stacked in this order from the side of the lower electrodes 14. Of these, the common hole transport layer 16D, blue light-emitting layer 16CB, electron transport layer 16E and electron injection layer 16F are provided as common layers to be shared among the red, green and blue organic EL elements 10R, 10G and 10B.

The red light-emitting layer 16CR and green light-emitting layer 16CG are made of a mixture of two materials, a high molecular weight (light-emitting) material and a low molecular weight material added thereto as in the third embodiment.

The hole transport layer 16BB of the blue organic EL element 10B may be made of a low molecular weight material (monomer or oligomer) or a high molecular weight material. Of the two types of low molecular weight materials used here, the term "monomer" refers to a substance, other than a compound such as a low molecular weight polymer or condensate, that has a single molecular weight and exists in the form of a single molecule as with the low molecular weight material added to the red and green light-emitting layers 16CR and 16CG. On the other hand, the term "oligomer" refers to a plurality of monomers bonded together whose weight-average molecular weight (Mw) is 50000 or less. Further, the high molecular weight material need only have a weight-average molecular weight of 50000 to 300000 and should particularly preferably have a weight-average molecular weight of 100000 to 200000 as with the high molecular weight material used as the hole transport layers 16BR and 16BG. It should be noted that the low and high molecular weight materials used as the hole transport layer 16BB may be made of a mixture of two or more materials having different molecular weights and weight-average molecular weights.

The common hole transport layer 16D is designed to provide improved hole injection efficiency to the blue light-emitting layer 16CB and provided over the entire surfaces of the red and green light-emitting layers 16CR and 16CG and the hole transport layer 16BB of the blue organic EL element 10B. Although depending on the overall configuration of the elements, the thickness of the common hole transport layer 16D should preferably be, for example, 1 nm to 20 nm, and more preferably be 1 nm to 10 nm.

The common hole transport layer 16D is formed by a vapor deposition method. Therefore, a low molecular weight material, and a monomer in particular, is preferred because polymerized molecules such as an oligomer or high molecular weight material may break down during the vapor deposition. It should be noted that the low molecular weight material used as the common hole transport layer 16D may be made of a mixture of two or more materials having different molecular weights.

As with the low molecular weight materials described in relation to the red, green and blue light-emitting layers 16CR, 16CG and 16CB in the third embodiment, among the materials that can be used as the common hole transport layer 16D are benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and their derivatives, and heterocyclic conjugated monomers, oligomers or polymers such as polysilane-based compounds, vinylcarbazole-based compounds, thiophene-based compounds or aniline-based compounds.

Among more specific materials that can be used are α-naphthylphenylphenylenediamine, porphyrin, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano 4,4,4-tris(3-methyl phenyl phenyl amino) triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene) and poly(2,2'-thienylpyrrol). However, the materials that can be used are not limited thereto.

This organic EL display device can be manufactured, for example, in the following manner.

Figure 16:
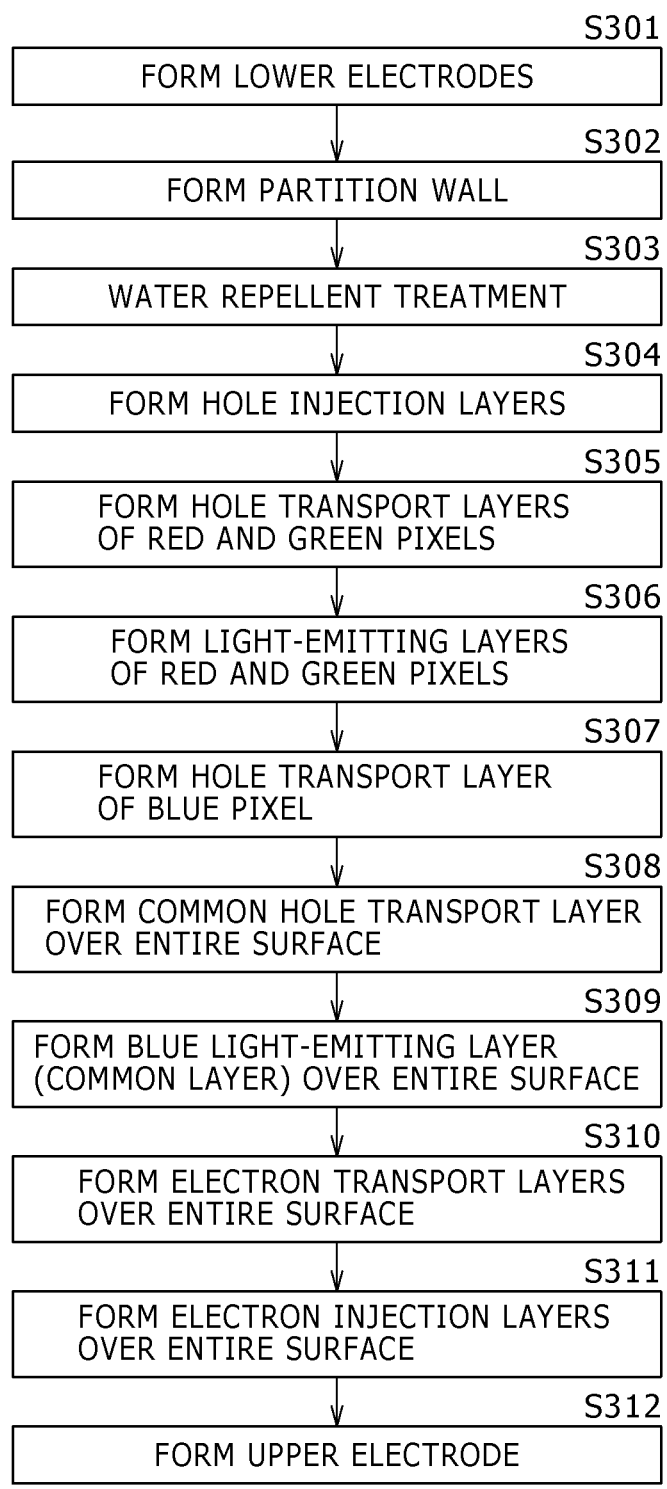
FIG. 16 is a diagram illustrating the flow of the manufacturing method of the organic EL display device shown in FIG. 15.

FIG. 16 is a diagram illustrating the flow of the manufacturing method of this organic EL display device. FIGS. 17A to 17J illustrate the manufacturing method shown in FIG. 16 in the order of execution of the process steps.

(Step of Forming the Lower Electrodes 14)

Figure 17A:
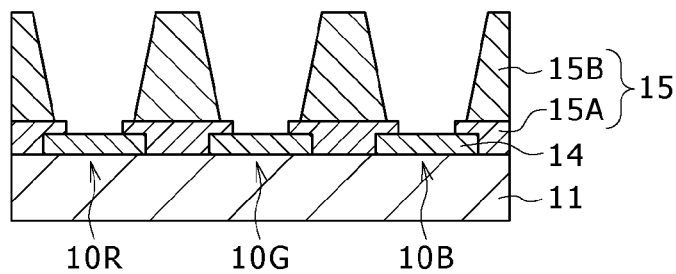
FIGS. 17A to 17C are sectional views illustrating the manufacturing method shown in FIG. 16 in the order of execution of the process steps.

First, the lower electrodes 14 are formed on the substrate 11 on which the pixel drive circuits 14 and a planarizing insulating film have been formed as illustrated in FIG. 17A in the same manner as in the first embodiment (step S301).

(Step of Forming the Partition Wall 15)

Next, the partition wall 15 made up of the lower and upper partition walls 15A and 15B is formed as illustrated in FIG. 17A in the same manner as in the first embodiment (step S302).

(Step of Performing Water Repellent Treatment)

Next, oxygen plasma treatment is performed on the side of the substrate 11 on which the lower electrodes 14 and partition wall 15 have been formed, followed by water repellent treatment (liquid repellent treatment) in the same manner as in the first embodiment (step S303), thus providing reduced wettability of the top and side surfaces of the upper partition walls 15B in particular.

(Step of Forming the Hole Injection Layers 16AR, 16AG and 16AB)

Figure 17B:
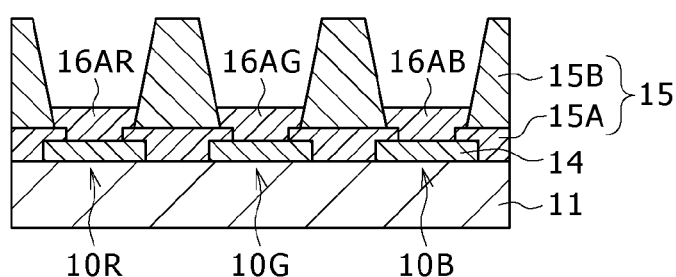

Then, the hole injection layers 16AR, 16AG and 16AB made of the above-described material are formed in the regions surrounded by the upper partition walls 15B as illustrated in FIG. 17B in the same manner as in the first embodiment (step S304).

(Step of Forming the Hole Transport Layers 16BR and 16BG)

Figure 17C:
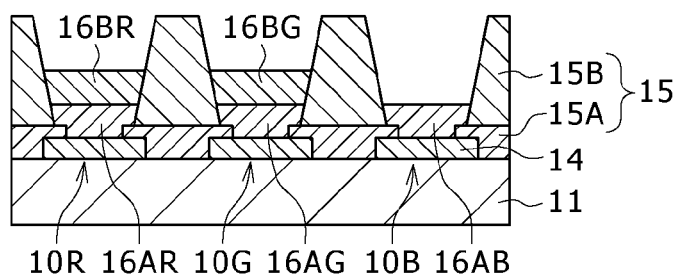

After the formation of the hole injection layers 16AR, 16AG and 16AB, the hole transport layers 16BR and 16BG made of the above-described high molecular weight material are formed respectively on the hole injection layers 16AR and 16AG respectively for the red and green organic EL elements 10R and 10G as illustrated in FIG. 17C in the same manner as in the first embodiment (step S305).

Here, each of the red and green organic EL elements 10R and 10G is adjacent to the blue organic EL elements 10B in the same or adjacent pixel 10 at least on its two sides opposed to each other. This suppresses non-uniform drying speed of the applied solution on the sides adjacent to the blue organic EL elements 10B, thus providing reduced imbalance in thickness of the red and green light-emitting layers 16BR and 16BG after drying as in the first embodiment. Therefore, improved uniformity or symmetry can be achieved in the thickness of the red and green light-emitting layers 16BR and 16BG.

(Step of Forming the Red and Green Light-Emitting Layers 16CR and 16CG)

Figure 17D:
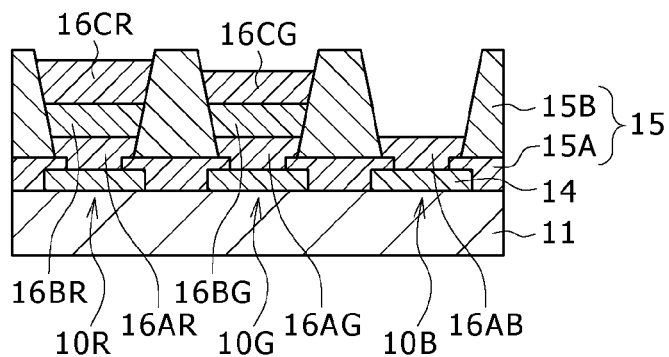
FIGS. 17D to 17G are continued from FIG. 17C and sectional views illustrating the process steps.

After the formation of the hole transport layers 16BR and 16BG, the red light-emitting layer 16CR made of the above-described high molecular weight compound is formed on the hole transport layer 16BR of the red organic EL element 10R as illustrated in FIG. 17D in the same manner as in the first embodiment. Further, the green light-emitting layer 16CG made of the above-described high molecular weight compound is formed on the hole transport layer 16BG of the green organic EL element 10G (step S306).

Here again, each of the red and green organic EL elements 10R and 10G is adjacent to the blue organic EL elements 10B in the same or adjacent pixel 10 at least on its two sides opposed to each other. This suppresses non-uniform drying speed of the applied solution on the sides adjacent to the blue organic EL elements 10B, thus providing reduced imbalance in thickness of the red and green light-emitting layers 16CR and 16CG after drying as in the first embodiment. Therefore, improved uniformity or symmetry can be achieved in the thickness of the red and green light-emitting layers 16CR and 16CG.

(Step of Forming the Hole Transport Layer 16BB of the Blue Organic EL Element 10B)

Figure 17E:
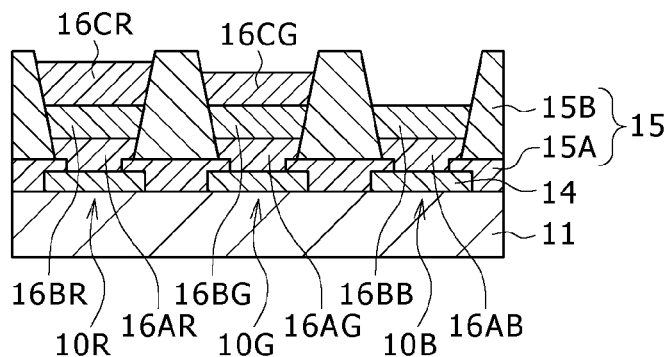

After the formation of the red and green light-emitting layers 16CR and 16CG, the hole transport layer 16BB made of the above-described low molecular weight material is formed on the hole injection layer 16AB of the blue organic EL element 10B as illustrated in FIG. 17E in the same manner as in the third embodiment (step S307).

(Order of the Steps)

The step of forming the hole transport layers 16BR and 16BG of the red and green organic EL elements 10R and 10G, that of forming the hole transport layer 16BB of the blue organic EL element 10B and that of forming the red and green light-emitting layers 16CR and 16CG are performed in the same order as in the second embodiment.

(Step of Forming the Common Hole Transport Layer 16D)

Figure 17F:
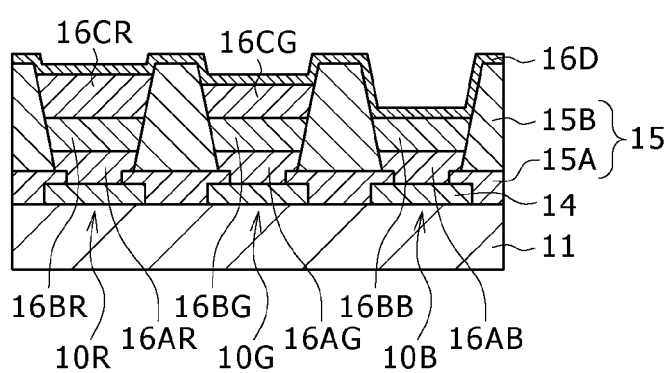

After the formation of the hole transport layer 16BB of the blue organic EL element 10B and the red and green light-emitting layers 16CR and 16CG, the common hole transport layer 16D made of the above-described low molecular weight material is formed as a common layer over the entire surfaces of the red and green light-emitting layers 16CR and 16CG and the hole transport layer 16BB of the blue organic EL element 10B by a vapor deposition method as illustrated in FIG. 17F (step S308).

(Step of Forming the Blue Light-Emitting Layer 16CB)

Figure 17G:
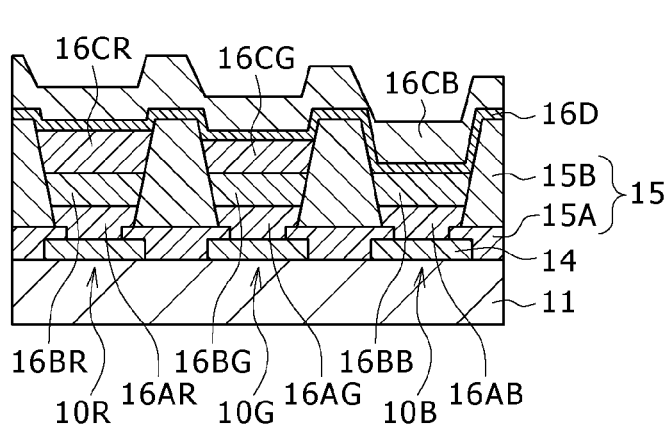

After the formation of the common hole transport layer 16D, the blue light-emitting layer 16CB made of the above-described low molecular weight material is formed as a common layer over the entire surface of the common hole transport layer 16D by a vapor deposition method as illustrated in FIG. 17G (step S309).

(Step of Forming the Electron Transport Layer 16E, Electron Injection Layer 16F and Upper Electrode 17)

Figure 17H:
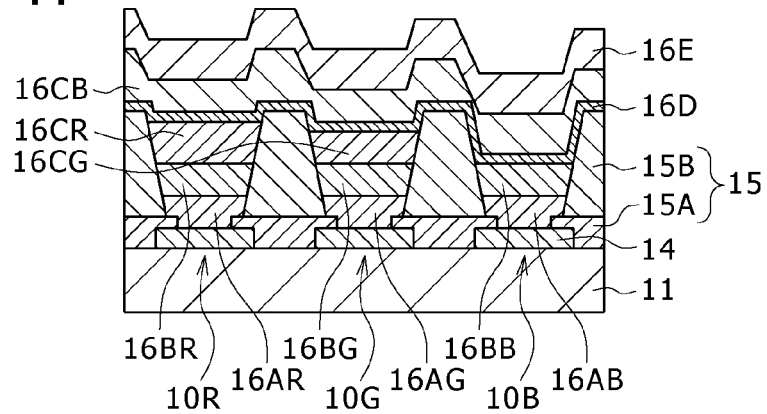
FIGS. 17H to 17J are continued from FIG. 17G and sectional views illustrating the process steps.
Figure 17I:
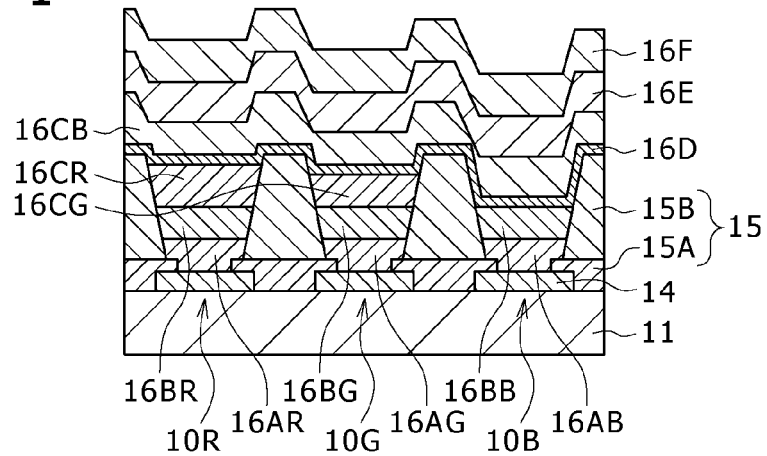
Figure 17J:
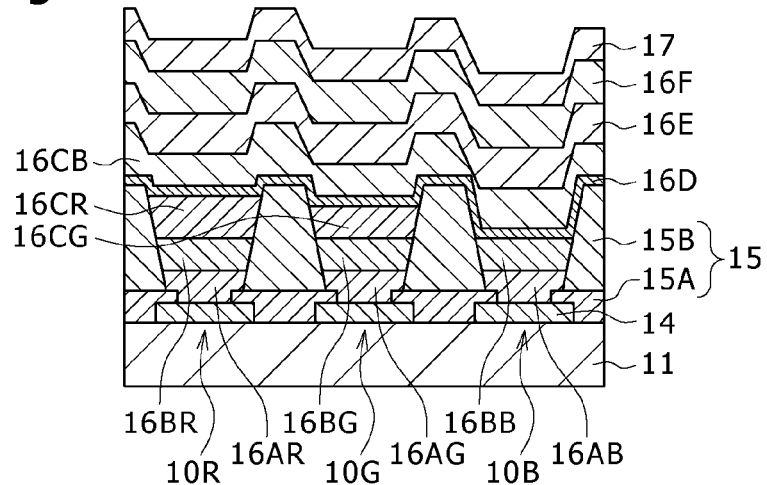

After the formation of the blue light-emitting layer 16CB, the electron transport layer 16E, electron injection layer 16F and upper electrode 17 made of the above-described materials are formed over the entire surface of the blue light-emitting layer 16CB by a vapor deposition method as illustrated in FIGS. 17H to 17J in the same manner as in the first embodiment (steps S310 to S312).

After the formation of the upper electrode 17, the protective layer 20 is formed as illustrated in FIG. 3 in the same manner as in the first embodiment. At this time, the common hole transport layer 16D, blue light-emitting layer 16CB, electron transport layer 16E, electron injection layer 16F, upper electrode 17 and protective layer 20 are each formed over the entire surface in the form of a solid film without using any mask. Further, the common hole transport layer 16D, blue light-emitting layer 16CB, electron transport layer 16E, electron injection layer 16F, upper electrode 17 and protective layer 20 are desirably formed successively in the same film forming equipment without being exposed to the atmosphere. This prevents the deterioration of the organic layer 16 caused by moisture in the atmosphere.

After the formation of the protective layer 20, a light-shielding film, and red, blue and green filters (not shown) are sequentially formed on the sealing substrate 40 made of the above-described material in the same manner as in the first embodiment.

Then, an adhesive layer (not shown) is formed on the protective layer 20. Finally, the sealing substrate 40 is attached to the protective film 20 with the adhesive layer sandwiched therebetween. This completes the display device shown in FIGS. 1 to 3.

In this organic EL display device 1A, the driving of the pixels is controlled in the same manner as in the first embodiment. As a result, the drive current Id is injected into the red, green and blue organic EL elements 10R, 10G and 10B, allowing for the holes and electrons to recombine for light emission. This light transmits through the lower electrodes 14 and substrate 11 before being extracted when the organic EL display device is a bottom emission type. The light transmits through the upper electrode 17, color filter (not shown) and sealing substrate 40 before being extracted when the organic EL display device is a top emission type.

If the blue light-emitting layer 16CB is provided directly on the blue hole transport layer 16BB formed by a coating method as in the second or third embodiment, the blue light-emitting layer 16CB may not be able to deliver its original characteristics due to the following reasons. The first reason is the reduction of hole injection characteristic to the blue light-emitting layer 16CB due, for example, to moisture or residual solvent that may find its way into the blue hole transport layer 16BB during the formation thereof by a coating method. The second reason is the deterioration of the blue hole transport layer 16BB due, for example, to contamination of its interface because the same layer 16BB is formed in an atmospheric environment.

In the organic EL display device according to the present embodiment, the common hole transport layer 16D made of a low molecular weight material is formed on the blue hole transport layer 16BB by a vapor deposition method. This suppresses moisture or other contaminants in the atmosphere from entering the blue hole transport layer 16BB, thus contributing to improved condition of the interface with the blue light-emitting layer 16CB. This ensures improved efficiency in injecting holes into the blue light-emitting layer 16CB, thus allowing for the same layer 16CB to provide the values close to its original characteristics.

It should be noted that because the common hole transport layer 16D is formed by a vapor deposition method, the same layer 16D is also formed on the red and green light-emitting layers 16CR and 16CG. As a result, the blue light-emitting layer 16CB is stacked above each of the red and green light-emitting layers 16CR and 16CG with the common hole transport layer 16D provided therebetween. The common hole transport layer 16D normally shows electron blocking characteristic on the red and green light-emitting layers 16CR and 16CG, thus resulting in degraded electron injection characteristic to the red and green light-emitting layers 16CR and 16CG. On the other hand, if the red and green light-emitting layers 16CR and 16CG are made only of a high molecular weight material as in the first or second embodiment, there is a large difference in energy level between the same layers 16CR and 16CG and the common hole transport layer 16D made of a low molecular weight material, possibly resulting in degraded hole transport capability. This leads to a lack of electrons and holes injected into the red and green light-emitting layers 16CR and 16CG, possibly resulting in increased drive voltage or reduced light emission efficiency. Further, because holes and electrons are not injected properly, the light emission of the red or green organic EL element 10R or 10G may be accompanied by emission of blue light that has peaks in the range of wavelengths from 430 nm to 500 nm. That is, red or green light is mixed with blue light, thus changing the chromaticity of the red and green organic EL elements 10R and 10G. This may present a serious problem for the display elements making up the display.

In contrast, in the present embodiment, the red and green light-emitting layers 16CR and 16CG are formed with a mixture of high and low molecular weight materials, thus contributing to reduced energy level. This provides improved hole transport capability and allows for adjustment as appropriate. Further, the common hole transport layer 16D is formed with a material of the same family as the low molecular weight material added to the red and green light-emitting layers 16CR and 16CG, thus providing reduced difference, for example, in energy level between the different layers. Further, the common hole transport layer 16D is formed with a material of the same family as the material of which the blue light-emitting layer 16CB is made, thus providing excellent capability of transporting electrons to be injected into the red and green light-emitting layers 16CR and 16CG. This contributes to reduced hole and electron transport barriers between each of the red and green light-emitting layers 16CR and 16CG and the common hole transport layer 16D, thus resolving the above problems with the drive voltage and light emission efficiency. Further, blue light emission is suppressed when the red or green organic EL element 10R or 10G emits light, thus keeping the chromaticity change of the red and green organic EL elements 10R and 10G to a minimum. That is, it is possible to provide the red and green organic EL elements 10R and 10G that can be used as display elements.

As described above, the common hole transport layer 16D made of a low molecular weight material is formed by a vapor deposition method over the entire surfaces of the hole transport layer 16BB and the red and green light-emitting layers 16CR and 16CG in the present embodiment, thus contributing to improved condition of the interface of the blue light-emitting layer 16CB in addition to the advantageous effects achieved by the first to third embodiments. This ensures improved efficiency in injecting holes into the blue light-emitting layer 16CB, thus allowing for the same layer 16CB to provide the values close to its original characteristics. That is, the present embodiment contributes to improved light emission efficiency and longer life of the blue organic EL element 10B, thus providing even higher light emission efficiency and longer life of the color organic EL display device having the red, green and blue organic EL elements 10R, 10G and 10B arranged and formed therein.

Further, a low molecular weight material is added to the red and green light-emitting layers 16CR and 16CG, thus making it easier to adjust the carrier balance between holes and electrons. This suppresses the reduction of electron injection characteristic and hole transport characteristic to the red and green light-emitting layers 16CR and 16CG resulting from the formation of the common hole transport layer 16D, blue light-emitting layer 16CB and electron transport layer 16E. That is, this keeps the reduction of light emission efficiency and life, increase in drive voltage and change in light emission chromaticity of the red and green organic EL elements 10R and 10G to a minimum.

Fifth Embodiment

Figure 18:
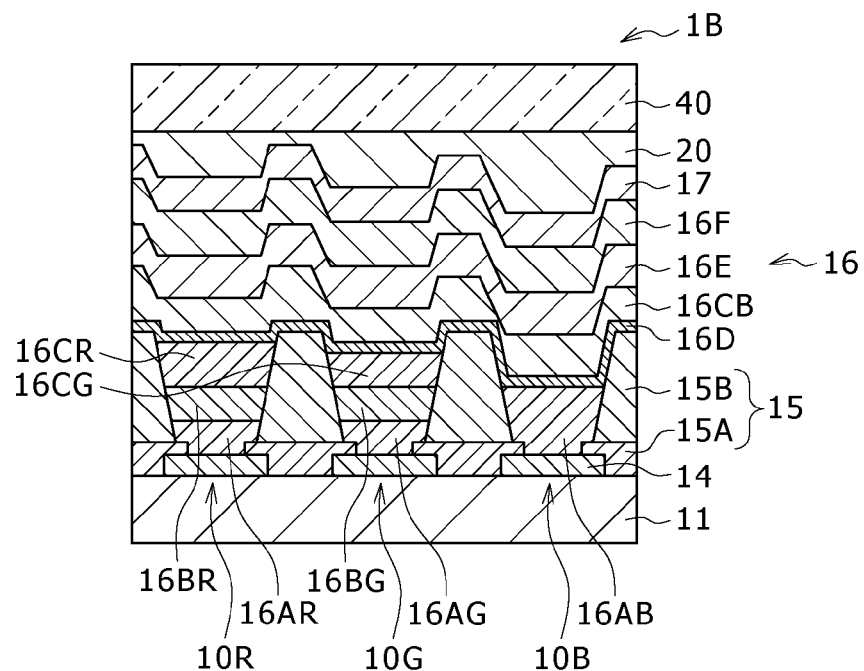
FIG. 18 is a sectional view illustrating the configuration of an organic EL display device according to a fifth embodiment of the present disclosure.

FIG. 18 illustrates the sectional configuration of the display region of an organic EL display device 1B according to a fifth embodiment of the present disclosure. The organic EL display device 1B is identical in configuration to the counterpart according to the fourth embodiment except that the common hole transport layer 16D is provided directly on the hole injection layer 16AB without providing the hole transport layer 16BB of the blue organic EL element 10B.

The organic layer 16 of the red organic EL element 10R includes, for example, the hole injection layer 16AR, hole transport layer 16BR, red light-emitting layer 16CR, common hole transport layer (second hole injection/transport layer) 16D, blue light-emitting layer 16CB, electron transport layer 16E and electron injection layer 16F that are stacked in this order from the side of the lower electrodes 14, as with the red organic EL element 10R according to the fourth embodiment. The organic layer 16 of the green organic EL element 10G includes, for example, the hole injection layer 16AG, hole transport layer 16BG, green light-emitting layer 16CG, common hole transport layer 16D, blue light-emitting layer 16CB, electron transport layer 16E and electron injection layer 16F that are stacked in this order from the side of the lower electrodes 14, as with the green organic EL element 10G according to the fourth embodiment. The organic layer 16 of the blue organic EL element 10B includes, for example, the hole injection layer 16AB, common hole transport layer 16D, blue light-emitting layer 16CB, electron transport layer 16E and electron injection layer 16F that are stacked in this order from the side of the lower electrodes 14 and differs from the counterpart according to the fourth embodiment in that there is no blue hole transport layer. Of these, the common hole transport layer 16D, blue light-emitting layer 16CB, electron transport layer 16E and electron injection layer 16F are provided as common layers to be shared among the red, green and blue organic EL elements 10R, 10G and 10B.

The organic EL display device according to the present embodiment provides even longer life of the blue organic EL element 10B in addition to the advantageous effect achieved by the fourth embodiment. Further, providing the common hole transport layer 16D directly on the hole injection layer 16AB of the blue organic EL element 10B contributes not only to reduced number of manufacturing process steps but also reduced cost.

Module and Application Examples

A description will be given below of application examples of the organic EL display device described in the above embodiments. The organic EL display device according to any one of the above embodiments is applicable as a display device of electronic equipment across all disciplines adapted to display a video signal fed thereto from external equipment or generated therein including a television set, digital camera, laptop personal computer, PDA such as mobile phone and video camcorder.

(Module)

Figure 19:
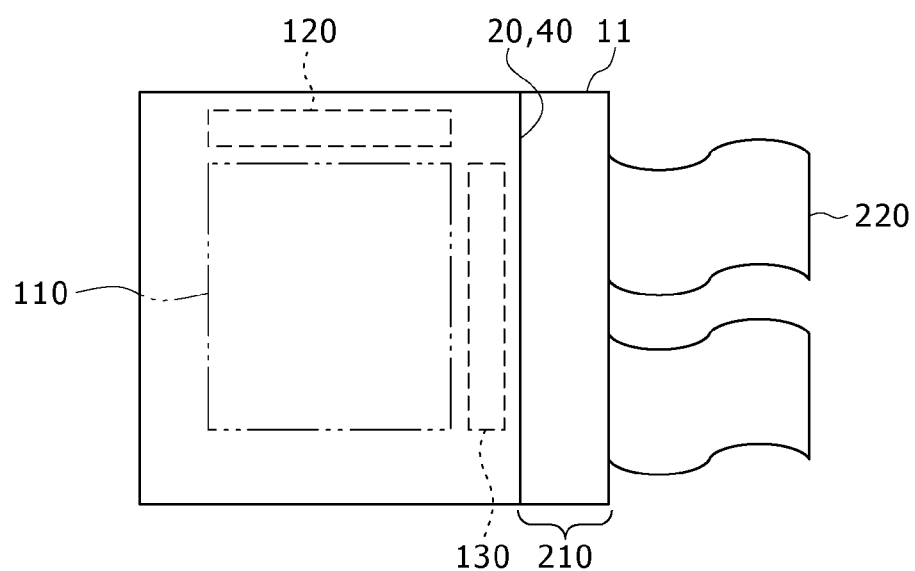
FIG. 19 is a plan view illustrating the rough configuration of a module that includes the display device according to one of the above embodiments.

The organic EL display device according to any one of the above embodiments is incorporated, for example, as a module as shown in FIG. 19 in a variety of electronic equipment including those described later as application examples 1 to 5. This module has, on one side of the substrate 11, a region 210 that is exposed from the protective layer 30 and sealing substrate 40. External connection terminals (not shown) are formed in the region 210 by extending wiring from the signal line drive circuit 120 and scan line drive circuit 130. The external connection terminals may have a flexible printed circuit (FPC) 220 for exchange of signals.

APPLICATION EXAMPLE 1

Figure 20:
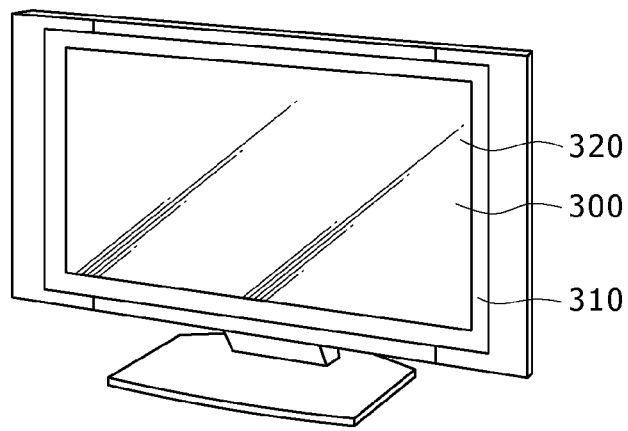
FIG. 20 is a perspective view illustrating the appearance of application example 1 according to one of the above embodiments is applied.

FIG. 20 illustrates the appearance of a television set to which the organic EL display device according to one of the above embodiments is applied. This television set has, for example, a video display screen section 300 that includes a front panel 310 and filter glass 320. The video display screen section 300 includes the organic EL display device according to one of the above embodiments.

APPLICATION EXAMPLE 2

Figure 21A:
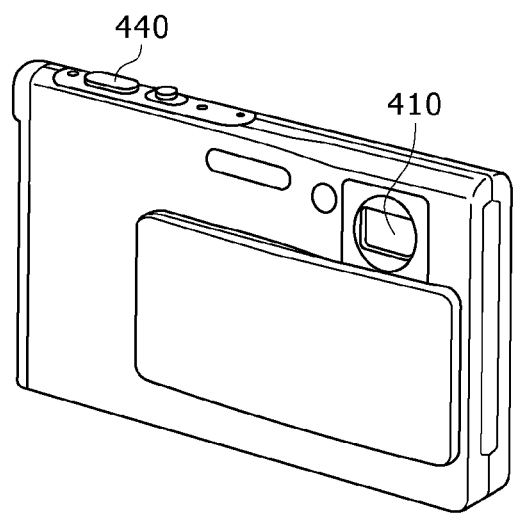
FIG. 21A illustrates the appearance of application example 2 as seen from the front.
Figure 21B:
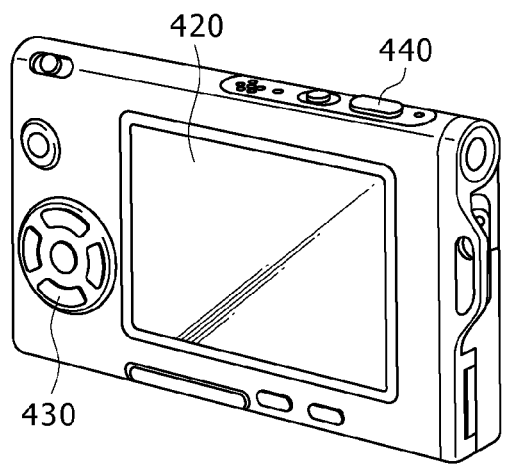
FIG. 21B illustrates the appearance thereof as seen from the rear.

FIGS. 21A and 21B illustrate the appearance of a digital camera to which the organic EL display device according to one of the above embodiments is applied. This digital camera has, for example, a flash-emitting section 410, display section 420, menu switch 430 and shutter button 440. The display section 420 includes the organic EL display device according to one of the above embodiments.

APPLICATION EXAMPLE 3

Figure 22:
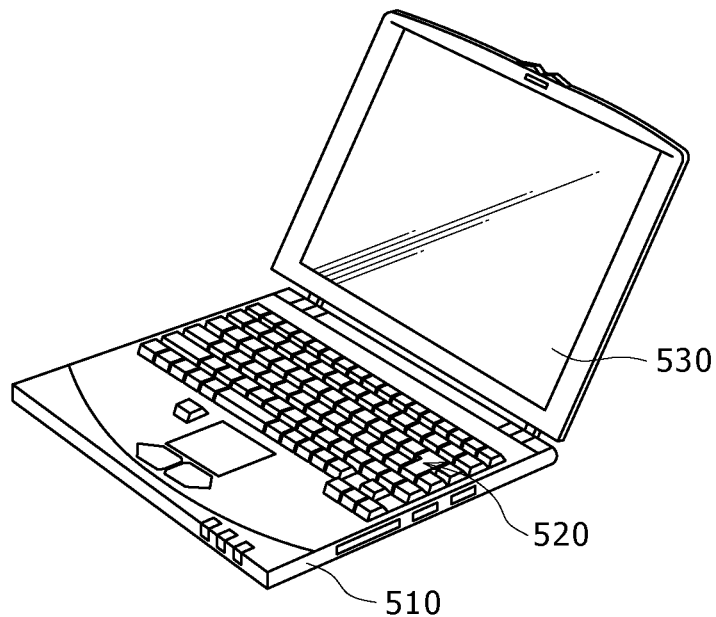
FIG. 22 is a perspective view illustrating the appearance of application example 3.

FIG. 22 illustrates the appearance of a laptop personal computer to which the organic EL display device according to one of the above embodiments is applied. This laptop personal computer has, for example, a main body 510, a keyboard 520 adapted to be manipulated for entry of text or other information and a display section 530 adapted to display an image. The display section 530 includes the organic EL display device according to one of the above embodiments.

APPLICATION EXAMPLE 4

Figure 23:
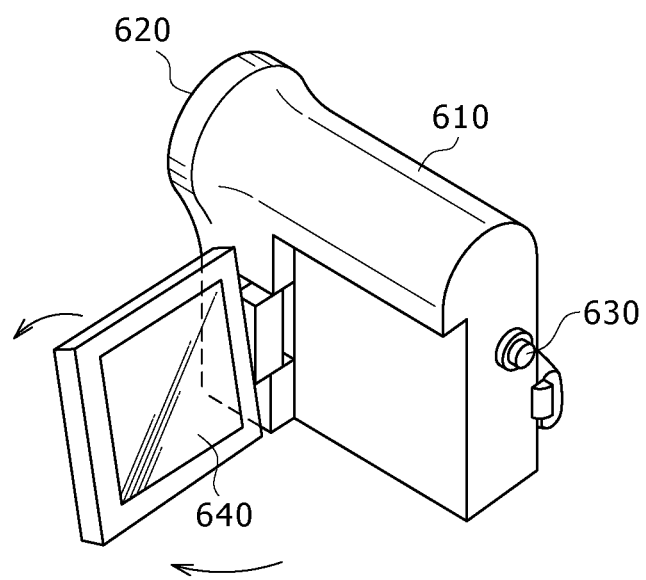
FIG. 23 is a perspective view illustrating the appearance of application example 4.

FIG. 23 illustrates the appearance of a video camcorder to which the organic EL display device according to one of the above embodiments is applied. This video camcorder has, for example, a main body section 610, lens 620 provided on the front-facing side surface of the main body section 610 to capture the image of the subject, imaging start/stop switch 630 and display section 640. The display section 640 includes the organic EL display device according to one of the above embodiments.

APPLICATION EXAMPLE 5

FIGS. 24A to 24G illustrate the appearance of a mobile phone to which the organic EL display device according to one of the above embodiments is applied. This mobile phone includes upper and lower enclosures 710 and 720 connected by a connection section (hinge section) 730 and has, for example, a display 740, subdisplay 750, picture light 760 and camera 770. The display 740 or subdisplay 750 includes the organic EL display device according to one of the above embodiments.

Although described above by way of preferred embodiments, the present disclosure is not limited to the above embodiments but may be modified in various manners.

For example, the materials and thicknesses of the different layers or the film formation methods and conditions described in the above embodiments are not limited. Instead, the different layers may be made of different materials and have different thicknesses or may be formed by different methods and under different conditions.

Further, although specific configurations of the red, green and blue organic EL elements 10R, 10G and 10B were described in the above embodiments, it is not necessary to provide all the layers. Still further, other layers may be additionally provided.

Still further, although a description was given of a three primary color display device having, as organic EL elements other than blue (second organic EL elements), red and green organic EL elements in the above embodiments, the second organic EL elements are at least one, and preferably two, of the red, green, yellow and white organic EL elements. For example, the present disclosure is applicable to a two primary color display device that includes blue and yellow organic EL elements.

Figure 25:
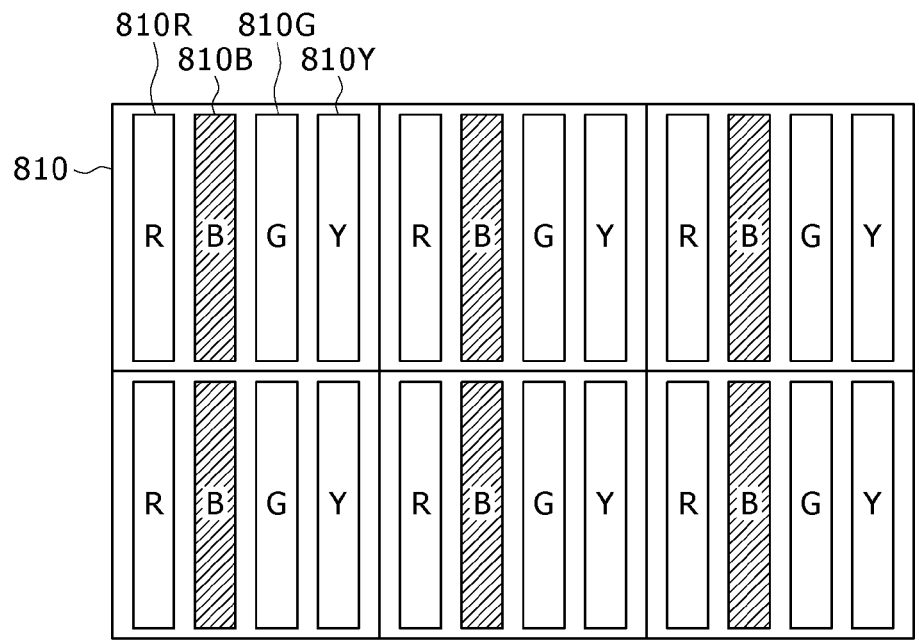
FIG. 25 is a diagram illustrating the problem with the use of four colors.

In addition, the present disclosure is applicable to a four primary color display device having, as second organic EL elements, yellow or white organic EL element, together with the red and green organic EL elements. In this case, if the red, blue, green and yellow organic EL elements 810R, 810B, 810G and 810Y are arranged in this order as illustrated in FIG. 25, the drying speed is high on the left side of each of the green organic EL elements 810G and on the right of each of the red organic EL elements 810R, thus resulting in larger film thicknesses.

Figure 26:
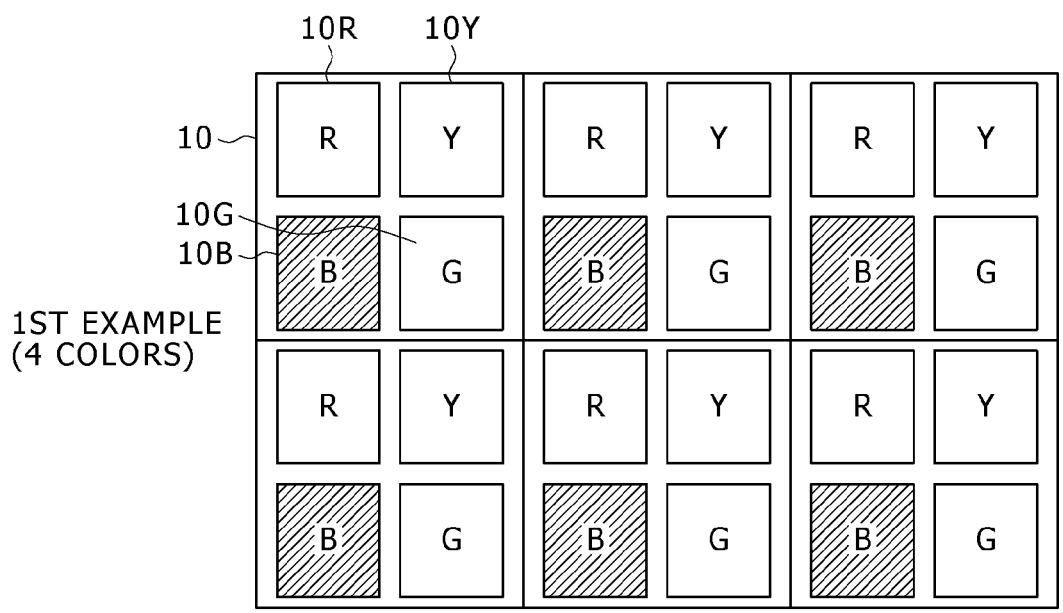
FIG. 26 is a diagram illustrating a first example of two-dimensional arrangement of organic EL elements when four colors are used.
Figure 27:
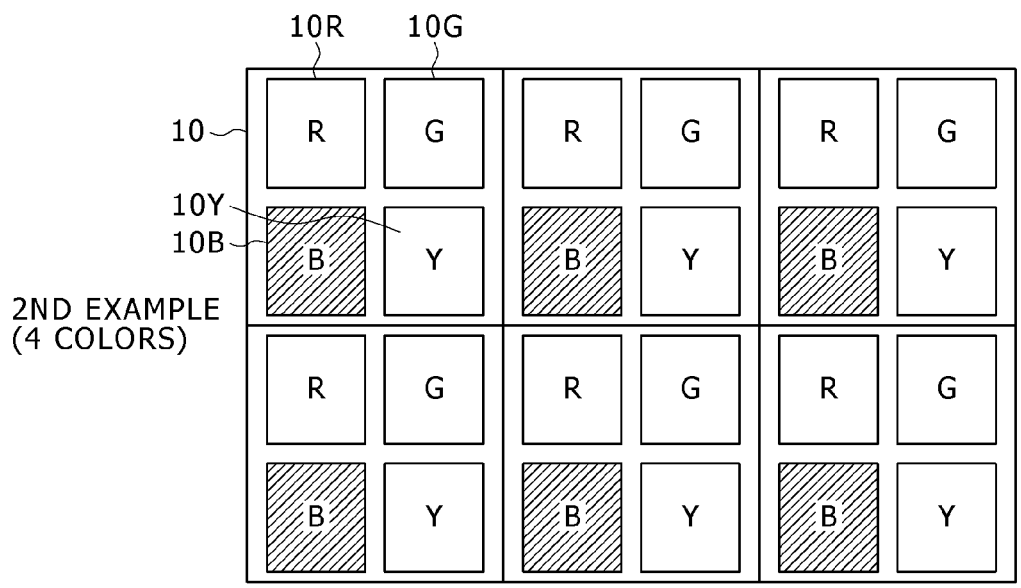
FIG. 27 is a diagram illustrating a second example of two-dimensional arrangement of organic EL elements when four colors are used.
Figure 28:
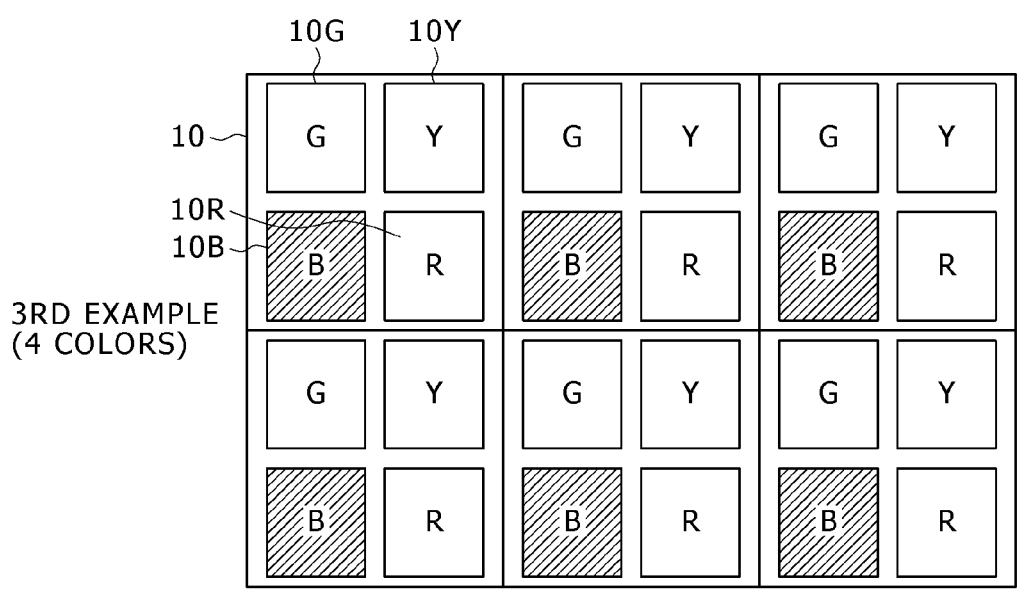
FIG. 28 is a diagram illustrating a third example of two-dimensional arrangement of organic EL elements when four colors are used.

Therefore, the rectangular (e.g., square) red, green and yellow organic EL elements 10R, 10G and 10Y are each arranged at one of the corners of each of the pixels 10, with the blue organic EL element 10B arranged at the remaining one corner as illustrated in FIGS. 26 to 28. As a result, each of the green organic EL elements 10G is adjacent to the blue organic EL elements 10B in the same or adjacent pixel on its left and right sides in the first example shown in FIG. 26. This suppresses non-uniform drying speed of the applied solution on the left and right sides of each of the green organic EL elements 10G, thus providing reduced imbalance in thickness of the green light-emitting layer 16CG after drying. Therefore, improved uniformity or symmetry can be achieved in the horizontal thickness distribution. On the other hand, each of the red organic EL elements 10R is adjacent to the blue organic EL elements 10B in the same or adjacent pixel on its upper and lower sides. This suppresses non-uniform drying speed of the applied solution on the upper and lower sides of each of the red organic EL elements 10R, thus providing reduced imbalance in thickness of the red light-emitting layer 16CR after drying. Therefore, improved uniformity or symmetry can be achieved in the vertical thickness distribution.

Each of the yellow organic EL elements 10Y is adjacent to the blue organic EL elements 10B in the same or adjacent pixel on its left and right sides in the second example shown in FIG. 27. This suppresses non-uniform drying speed of the applied solution on the left and right sides of each of the yellow organic EL elements 10Y, thus providing reduced imbalance in thickness of the yellow light-emitting layer after drying. Therefore, improved uniformity or symmetry can be achieved in the horizontal thickness distribution. The same as in the first example holds for the red organic EL elements 10R.

Each of the red organic EL elements 10R is adjacent to the blue organic EL elements 10B in the same or adjacent pixel on its left and right sides in the third example shown in FIG. 28. This suppresses non-uniform drying speed of the applied solution on the left and right sides of each of the red organic EL elements 10R, thus providing reduced imbalance in thickness of the red light-emitting layer 16CR after drying. Therefore, improved uniformity or symmetry can be achieved in the horizontal thickness distribution. Further, each of the green organic EL elements 10G is adjacent to the blue organic EL elements 10B in the same or adjacent pixel on its upper and lower sides in the first example shown in FIG. 26. This suppresses non-uniform drying speed of the applied solution on the upper and lower sides of each of the green organic EL elements 10G, thus providing reduced imbalance in thickness of the green light-emitting layer 16CG after drying. Therefore, improved uniformity or symmetry can be achieved in the vertical thickness distribution.

Figure 29:
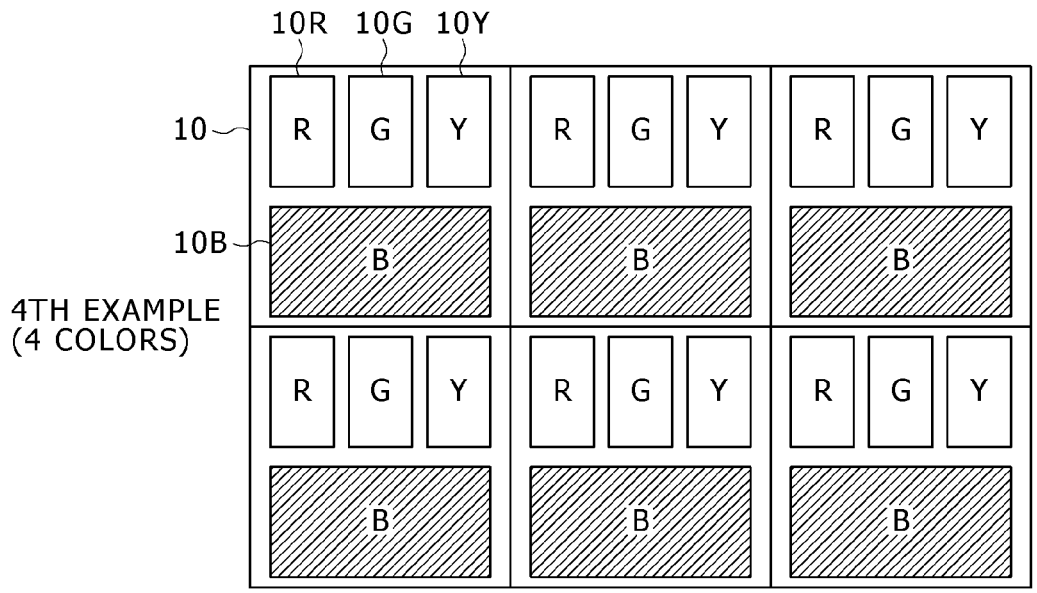
FIG. 29 is a diagram illustrating a fourth example of two-dimensional arrangement of organic EL elements when four colors are used.
Figure 30:
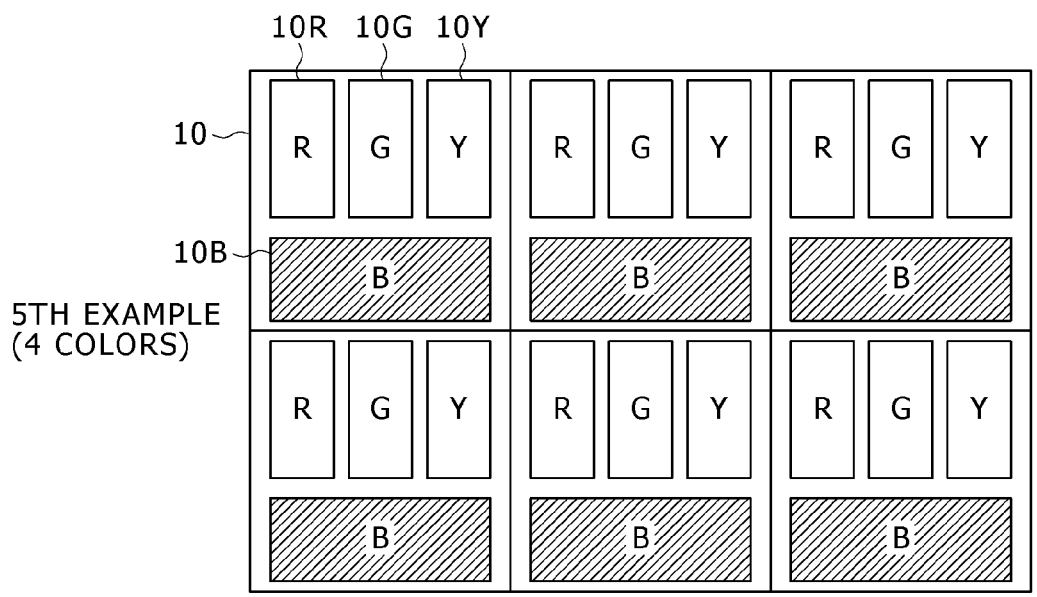
FIG. 30 is a diagram illustrating a fifth example of two-dimensional arrangement of organic EL elements when four colors are used.

Alternatively, the red, green and yellow organic EL elements 10R, 10G and 10Y may be arranged in one direction as illustrated as the fourth example in FIG. 29. Each of the red, green and yellow organic EL elements 10R, 10G and 10Y is adjacent to the blue organic EL elements 10B in the same or adjacent pixel on its upper and lower sides. This suppresses non-uniform drying speed of the applied solution on the upper and lower sides of each of the red, green and yellow organic EL elements 10R, 10G and 10Y, thus providing reduced imbalance in thickness of the red and green light-emitting layers 16CR and 16CG and the yellow light-emitting layer after drying. Therefore, improved uniformity or symmetry can be achieved in the vertical thickness distribution. This fourth example is more preferred because the red, green and yellow organic EL elements 10R, 10G and 10Y are identically shaped (identical in area). Further, the aperture ratio can be adjusted by shortening the short sides of the blue organic EL elements 10B and lengthening the long sides of the red, green and yellow organic EL elements 10R, 10G and 10Y as illustrated as the fifth example in FIG. 30.

It should be noted that the same also holds true when the yellow organic EL elements 10Y are replaced by three white organic EL elements in FIGS. 26 to 30.

Further, although a case was described in the above embodiments in which the present disclosure is applied to active matrix display devices, the present disclosure is also applicable to passive matrix display devices. Still further, the configuration of the pixel drive circuit adapted to achieve active matrix driving is not limited to that described in the above embodiments. Instead, capacitive elements and transistors may be added as necessary. In this case, necessary drive circuits may be added in addition to the signal line drive circuit 120 and scan line drive circuit 130 in response to the change in the pixel drive circuit.

The present disclosure contains subject matter related to that disclosed in Japanese Priority Patent Application JP 2010-225959 filed in the Japan Patent Office on Oct. 5, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. An organic electroluminescence display device comprising:
a substrate;
lower electrodes on the substrate, one for each of a blue first organic electroluminescence element and second organic electroluminescence elements of other colors;
first hole injection/transport layers, each of which is on or above the lower electrode for one of the first and second organic electroluminescence elements and has at least a hole injection or hole transport characteristic;
second organic light-emitting layers of colors other than blue, each of which is provided on one of the first hole injection/transport layers of the second organic electroluminescence elements;
a blue first organic light-emitting layer over the entire surfaces of the second organic light-emitting layers and the first hole injection/transport layer of the first organic electroluminescence element, the blue first organic light-emitting layer being made of a low molecular weight material;
electron injection/transport layers sequentially over the entire surface of the first organic light-emitting layer, each of the electron injection/transport layers having at least an electron injection or electron transport characteristic; and
an upper electrode,
wherein,
a plurality of pixels, each having the first and second organic electroluminescence elements arranged in the same positional relationship, are provided in the organic electroluminescence display device,
the second organic electroluminescence elements are each arranged at one of the two corners on a diagonal line in each of the plurality of pixels and
each of at least two colors of the second organic electroluminescence elements is adjacent to the first organic electroluminescence elements in the same or adjacent pixel at least on its two sides opposed to each other.

2. The organic electroluminescence display device of claim 1, wherein each of the second organic electroluminescence elements is at least one of the red, green, yellow and white organic electroluminescence elements.

3. The organic electroluminescence display device of claim 2, wherein:
the first and second organic electroluminescence elements are long, narrow and rectangular,
the second organic electroluminescence elements are arranged equidistantly in the direction parallel to the short sides of the rectangles, and
the first organic electroluminescence element is arranged between the second organic electroluminescence elements.

4. The organic electroluminescence display device of claim 2, wherein the second organic electroluminescence elements are arranged in one direction.

5. The organic electroluminescence display device of claim 3, wherein the second organic electroluminescence elements differ in area from the first organic electroluminescence element.

6. The organic electroluminescence display device of claim 1, wherein a second hole injection/transport layer made of a low molecular weight material is between the entire surfaces of the second organic light-emitting layers and the first hole injection/transport layer of the first organic electroluminescence element and the blue first organic light-emitting layer.

7. The organic electroluminescence display device of claim 6, wherein:
the first hole injection/transport layer of the first organic electroluminescence element has only a hole injection layer made of a high molecular weight material, and
the first hole injection/transport layers of the second organic electroluminescence elements are made of a high molecular weight material.

8. The organic electroluminescence display device of claim 1, wherein:
the first hole injection/transport layer of the first organic electroluminescence element has a hole injection layer made of a high molecular weight material and a hole transport layer made of a low molecular weight material provided on top of the hole injection layer, and
the first hole injection/transport layers of the second organic electroluminescence elements are made of a high molecular weight material.

9. The organic electroluminescence display device of claim 6, wherein:
second light-emitting layers of the second organic electroluminescence elements each include high and low molecular weight materials, and
the mixing ratio between the high and low molecular weight materials is from 10:1 to 1:2.

* * * * *